(12) United States Patent
Malkin

(10) Patent No.: US 9,071,262 B1
(45) Date of Patent: Jun. 30, 2015

(54) CALIBRATION OF HIGH-SPEED INTERLEAVED ARRAYS

(71) Applicant: APPLIED MICRO CIRCUITS CORPORATION, Sunnyvale, CA (US)

(72) Inventor: Moshe Malkin, Palo Alto, CA (US)

(73) Assignee: Applied Micro Circuits Corporation, Sunnyvale, CA (US)

(*) Notice: Subject to any disclaimer, the term of this patent is extended or adjusted under 35 U.S.C. 154(b) by 0 days.

(21) Appl. No.: 14/162,899

(22) Filed: Jan. 24, 2014

(51) Int. Cl.
| H03M 1/10 | (2006.01) |
| H04B 17/21 | (2015.01) |
| H03M 1/06 | (2006.01) |
| H04L 1/00 | (2006.01) |

(52) U.S. Cl.
CPC ............. *H03M 1/1009* (2013.01); *H04B 17/21* (2015.01); *H04L 1/00* (2013.01); *H03M 1/06* (2013.01)

(58) Field of Classification Search
CPC .......................... H04B 17/0062; H04L 1/0026
USPC ................................................. 341/118, 120
See application file for complete search history.

(56) References Cited

U.S. PATENT DOCUMENTS

| 2010/0192027 A1* | 7/2010 | Johansson ...................... 714/700 |
| 2011/0058596 A1* | 3/2011 | Agazzi et al. .................. 375/232 |
| 2012/0007756 A1* | 1/2012 | Agazzi ........................... 341/118 |
| 2013/0063608 A1* | 3/2013 | Tierney et al. ................ 348/192 |

* cited by examiner

*Primary Examiner* — Howard Williams
(74) *Attorney, Agent, or Firm* — Amin, Turocy & Watson, LLP

(57) ABSTRACT

Techniques for calibration of high-speed interleaved analog-to-digital converter (ADC) arrays are presented. A transceiver comprises an ADC component that comprises an array of sub-ADCs that can be interleaved to facilitate high-speed data communications. The ADC component processes signals received from a remote transmitter to facilitate recovering the received data. The transceiver can comprise a calibration component that determines transfer characteristics of the communication channel or medium between the transceiver and the remote transmitter, and the transfer characteristics of the remote transmitter to each of the sub-ADCs of the array, based on the recovered data. The calibration component calibrates sub-ADCs of the array to facilitate correcting sub-ADC path differences, based on the respective transfer characteristics, to facilitate mitigating distortions that would be caused by the path differences, wherein the calibration component can use channel estimation to determine the transfer functions of the sub-ADCs of the array.

20 Claims, 12 Drawing Sheets

CALIBRATION OF HIGH-SPEED INTERLEAVED ARRAYS

TECHNICAL FIELD

The subject disclosure relates generally to communication of information, and more particularly to calibration of high-speed interleaved arrays.

BACKGROUND

Communication devices, such as transceivers, can be used to transmit or receive voice data or other data from other communication devices. The voice data or other data can be communicated via a wireline or wireless communication connection. The trend has been to increase the amount of data that can be communicated and the speed of communication of data.

As communication data rates, speeds, and bandwidths grow, the circuits used to transmit, process, and receive data also have to process high bandwidth signals. One component used by many systems using digital signal processing is an analog-to-digital converter (ADC) that can be used to convert analog signals (e.g., voice signals) into a digital form for further digital signal processing. One approach for designing an ADC that can support relatively high bandwidth with high sampling speeds is to interleave an array of ADCs (e.g., an array of sub-ADCs), wherein each sub-ADC of the array can operate at a relatively lower speed. The lower sampling digital data samples from the sub-ADCs of the array can be combined to generate a high-speed digital data stream. This can enable the sub-ADCs of the array to operate at lower speeds and so the sub-ADCs can be designed with the limitation of current integrated circuit processing technology. A challenge with such a conventional interleaved ADC design can be that any processing differences between the sub-ADCs can contribute to the distortion of the combined digital stream. Such processing differences or mismatches can include, for example, different low-frequency offsets, bulk gains, delays, and more generally, different path transfer functions associated with the sub-ADCs of the array.

System designers often can attempt to design an ADC array such that these path differences can be relatively small. However, for more efficient area and power designs for high-speed communication systems, there can be undesirable power and area penalties incurred as well as more complex circuit designs being employed to keep these distortions at an acceptable level. These penalties can be significant and can contribute significantly to the system's power and area requirements, and it can therefore be desirable to avoid such penalties and power and area requirements.

Also, in conventional systems, auxiliary hardware, such as a digital-to-analog converter (DAC), often can be used (e.g., and/or required) to correct these distortions by generating a test/calibration signal that can be used to calibrate or correct the path differences. Such a conventional design can add to the cost and complexity of the system and/or can be of limited use, for example, if the test signal interferes with the communication channel's signal transmission, and thus, as a result, such calibration typically only can be allowed to be carried out during specific time periods before data is actually being transmitted on the communication channel.

Another conventional method for correcting such distortions associated with an array of sub-ADCs can be using sampling arrays that can oversample the received signal, wherein the information gleaned from oversampling the received signal can be used to calibrate and correct the processing path differences associated with the sub-ADCs. However, such conventional approach can significantly complicate the system design and can result in an undesirably higher amount of power and area being used for the system design because of the higher sampling speed used to obtain the oversampled channel signal.

Some other conventional methods for correcting such distortions associated with an array of sub-ADCs can include adding another ADC or one or more sub-ADCs that can be used to calibrate the paths of the other sub-ADCs of the array that can be used to process the actual channel signal. However, these conventional methods also can employ to undesirably costly and inefficient system designs.

The above-described description is merely intended to provide a contextual overview of current systems associated with transceivers and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example embodiment, disclosed herein is a system that comprises a converter component comprising a set of converter sub-components for converting respective time-delayed analog signals, associated with an analog signal received from a remote communication component, to respective digital data samples. The system further comprises a calibration component for determining respective transfer functions associated with respective converter sub-components of the set of converter sub-components based at least in part on the respective data associated with the respective digital data samples, and calibrating the respective converter sub-components based at least in part on the respective transfer functions to facilitate mitigating path differences between the respective converter sub-components.

In another example embodiment, disclosed herein is a method that comprises determining respective transfer functions associated with respective converter sub-components of a set of converter sub-components based at least in part on respective data associated with respective digital data samples that are based at least in part on respective time-delayed analog signals, associated with an analog signal received from a remote communication device. The method further comprises adjusting the respective converter sub-components based at least in part on the respective transfer functions to facilitate mitigating path differences between the respective converter sub-components.

In yet another example embodiment, disclosed herein is a system that comprises means for digitizing respective time-delayed analog signals, associated with an analog signal received from a remote communication device, to generate respective digital data samples that correspond to the respective time-delayed analog signals, wherein the means for digitizing comprises a set of sub-means for digitizing. The system also comprises means for determining respective transfer functions associated with respective sub-means for digitizing of the set of sub-means for digitizing based at least in part on respective data associated with the respective digital data samples. The system further comprises means for calibrating the respective sub-means for digitizing based at least in part on the respective transfer functions to facilitate reducing path differences between the respective sub-means for digitizing.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
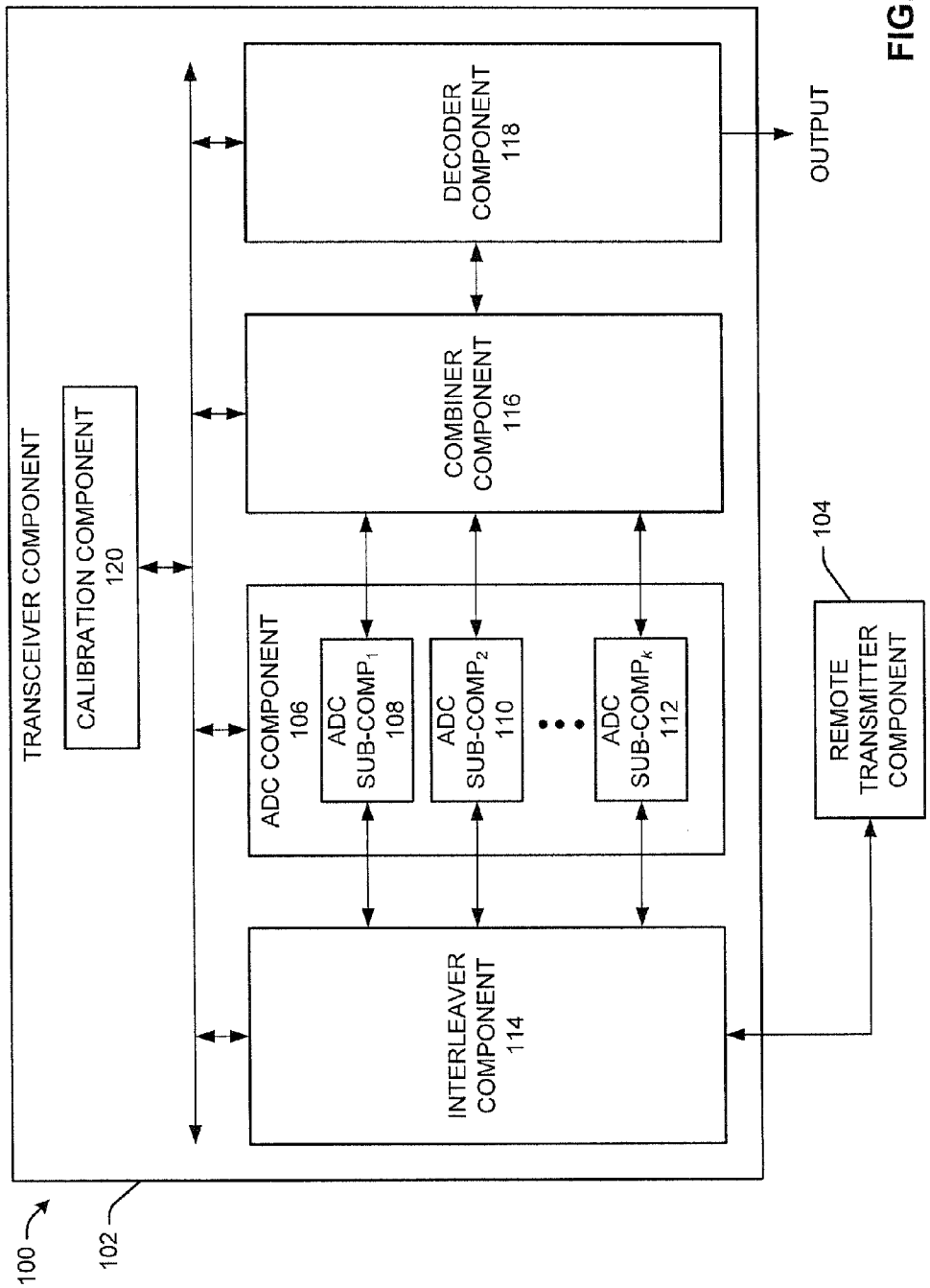
FIG. 1 illustrates a block diagram of an example, non-limiting system that can facilitate calibrating sub-analog-to-digital converters (sub-ADCs) of an array of sub-ADCs of a transceiver component to facilitate correcting or mitigating sub-ADC path differences, in accordance with various aspects and embodiments of the disclosed subject matter.

The disclosure herein is described with reference to the drawings, wherein like reference numerals are used to refer to like elements throughout. In the following description, for purposes of explanation, numerous specific details are set forth in order to provide a thorough understanding of the disclosed subject matter. It may be evident, however, that various disclosed aspects can be practiced without these specific details. In other instances, well-known structures and devices are shown in block diagram form in order to facilitate describing the disclosed subject matter.

Techniques for calibration of high-speed interleaved analog-to-digital converter (ADC) arrays are presented. A transceiver component can comprise an ADC component that can comprise an array of sub-ADCs that can be interleaved to facilitate high-speed data communications. The transceiver component can receive signals (e.g., analog signals), comprising data, from a remote transmitter component (e.g., a transmitter, a transceiver, or another type of communication device). When an analog signal is received by the transceiver component, an interleaver component can interleave the received analog signal across the sub-ADCs of the array, wherein the interleaver component or a calibration component can process the analog signal to implement or introduce respective time delays to the analog signal to generate a set of time-delayed analog signals (e.g., having respective time delays) prior to it being input to the respective sub-ADCs of the array. The sub-ADCs of the array, and/or another component(s) of the transceiver component, can process (e.g., sample, convert, decode, and/or otherwise process) the respective time-delayed analog signals to facilitate recovering (e.g., facilitate determining, identifying, decoding, and/or decrypting, etc.) the data (e.g., in digital form) sent by the remote transmitter.

The transceiver component also can comprise a calibration component that can calibrate or adjust the sub-ADCs of the array to facilitate correcting or mitigating sub-ADC path differences. The calibration component can perform such calibration or adjustment of the sub-ADCs at virtually any desired time, such as, for example, during start-up of the ADC component or associated device (e.g., transceiver component), during showtime, during or in connection with a data transfer associated with the transceiver component, periodically, in response to occurrence of a condition (e.g., in response to detection of a condition), and/or at another desired time.

The calibration component can determine transfer characteristics of the communication channel or medium between the transceiver component and the remote transmitter component, and the transfer characteristics of the remote transmitter component with respect to each of the sub-ADCs of the array, based at least in part on an analysis of the recovered data. For instance, the calibration component is able to determine the respective transfer characteristics because the digital data stream that is output by a sub-ADC can be a function of the remotely transmitted data and the channel characteristics of the sub-ADC path associated with the sub-ADC. For each sub-ADC of the array, the calibration component also can know the samples of the received signals that come from a specific sub-ADC and the remotely transmitted data used to generate the samples. Based at least in part on knowing the samples for the specific sub-ADC and the remotely transmitted data used to generate the samples, the calibration component can determine the transfer function of the specific sub-ADC, for example, using channel estimation. The calibration component can calibrate respective sub-ADCs of the array to facilitate correcting or mitigating sub-ADC path differences, based at least in part on the respective transfer characteristics or transfer functions, to facilitate mitigating distortions that would otherwise have be caused as a result of the uncorrected or unmitigated path differences. The respective sub-ADCs of the array, as calibrated by the calibration component, can facilitate providing respective digital data substreams, which can correspond to the received signal (e.g., analog signal), as an output. The ADC component or another component (e.g., a combiner component) can combine, integrate, or deinterleave the respective digital data substreams of the respective sub-ADCs to generate a digital data stream that can accurately represent the data contained in the received analog signal.

FIG. 1 illustrates a block diagram of an example, non-limiting system 100 that can facilitate calibrating sub-ADCs of an array of sub-ADCs of a transceiver component to facilitate correcting or mitigating sub-ADC path differences, in accordance with various aspects and embodiments of the disclosed subject matter. The system 100 can be or can comprise, for example, a high-speed communication and/or sampling system that can perform analog to digital conversion of analog signals at a desirably high rate of speed. The system 100 can be used to facilitate voice or data communications at one or more desired speeds, such as, for example, 10 gigabit per second (G), 40 G, 100 G, and/or a faster or different communication rate of speed. The system 100 can be employed in connection with an electrical transceiver, an optical transceiver, a wireless transceiver, a backplane transceiver, a chip-to-chip transceiver, or any of a variety of other types of transceivers.

The system 100 can comprise a transceiver component 102 (e.g., transceiver) that can be employed to communicate traffic (e.g., voice or data traffic), wherein the transceiver component 102 can receive traffic from a communication device, such as a remote transmitter component 104, and can transmit traffic to another communication device. The transceiver component 102 can be, or can be part of, a device that can communicate traffic. For example, the transceiver component 102 can be, or can be part of, a modem or router (e.g., a 10 G modem or router (e.g., a 10 G-baseT modem or router), a 40 G modem or router (e.g., a 40 G-baseT modem or router), a 100 G modem or router (e.g., a 100 G-baseT modem or router), or a modem or router that can employ another (e.g., faster or different) communication rate), a switch that can facilitate communication of traffic, a communication device that can employ optical communications technology and/or wireless communications technology, or another type of communication device.

The transceiver component 102 can comprise one or more (e.g., 1, 2, 3, 4, . . . ) transmitters and one or more (e.g., 1, 2, 3, 4, . . . ) receivers that can facilitate transmitting and receiving voice or data communications. In some implementations, the transceiver component 102 can employ a full-duplex system that can allow simultaneous communication in both directions. The transceiver component also can employ one or more sensing devices such as one or more antennas that can facilitate voice or data communications.

The transceiver component 102 also can comprise an ADC component 106 that can convert analog signals received from another communication device, such as the remote transmitter component 104, to corresponding digital signals. The ADC component 106 can comprise a set of ADC sub-components (also referred to herein as sub-ADCs) that can be employed to process received signals (e.g., to convert received analog signals to corresponding digital signals). The set of ADC sub-components can comprise, for example, ADC sub-component$_1$ 108, ADC sub-component$_2$ 110, up through ADC sub-component$_k$ 112, wherein k can be virtually any desired number. The set of ADC sub-components (e.g., 108, 110, 112, etc.) can be structured in the form of an array of ADC sub-components that can be interleaved and can operate in parallel to facilitate supporting a desired high bandwidth and performing high-speed processing of the received signals, as more fully disclosed herein.

To facilitate interleaving, the transceiver component 102 also can comprise an interleaver component 114 that can be employed to interleave the received analog signal across the respective interleaved ADC sub-components (e.g., 108, 110, 112, etc.) of the array, wherein the interleaver component 114 or the calibration component 120 can process the analog signal to implement or introduce respective time delays to the analog signal to generate time-delayed analog signals (e.g., having respective time delays) prior to the signal being input to the ADC component 106. The interleaver component 114 can comprise a desired number of outputs, such as k outputs, that can provide the time-delayed analog signals (e.g., with respective delays) to the respective inputs of the respective ADC sub-components (e.g., 108, 110, 112, etc.). The respective ADC sub-components (e.g., 108, 110, 112, etc.) can sample or perform other processing on the respective time-delayed analog signals at the specified sampling or processing rate of the ADC sub-components to facilitate determining an analog value of each data sample and converting or digitizing the analog value of the data sample to a corresponding digital value to generate a corresponding digital data sample to facilitate recovering the data from the respective time-delayed analog signals.

For instance, the respective ADC sub-components (e.g., 108, 110, 112, etc.) can operate at a relatively lower speed to process (e.g., sample, convert or digitize, and/or otherwise process) the respective portions of the received signals, but due in part to the interleaving and parallel operation of the ADC sub-components (e.g., 108, 110, 112, etc.), the combined operation of the respective ADC sub-components (e.g., 108, 110, 112, etc.) can enable the ADC component 106 to process the received signals at a desirably high speed to produce a corresponding digital data stream as an output. For example, the respective digital data samples from the respective ADC sub-components (e.g., 108, 110, 112, etc.) produced at a relatively lower speed can be combined (e.g., by a combiner component 116) to generate a higher speed digital data stream, wherein the higher speed of the generated digital data stream can be a function of the number of ADC sub-components and the sampling or processing speed of the ADC sub-components. As a specific non-limiting example, if it is desired to have the ADC component 106 convert analog to signals to digital signals at a rate of 10 G, and if it is desired to use 1 G ADC sub-components (e.g., sampling or processing at 1 G each) to form the ADC component 106, the ADC component 106 can be configured to comprise 10 1 G ADC sub-components that can be interleaved and can operate in parallel to facilitate processing received analog signals, wherein k=10. The interleaving, and parallel operation, of the 10 ADC sub-components can facilitate enabling the ADC component 106 to process received analog signals at a rate of 10 G.

The respective ADC sub-components (e.g., 108, 110, 112, etc.) of the array, and/or another component(s), such as a decoder component 118, of the transceiver component 102, can process (e.g., sample, convert or digitize, decode, and/or otherwise process (e.g., decrypt)) the analog signal to facilitate recovering (e.g., facilitate determining, identifying, etc.) the data (e.g., in digital form) received by the transceiver component 102 from the remote transmitter component 104. For instance, each of the respective ADC sub-components can sample the analog signal to generate a sample of the analog signal, and the sample can be converted or digitized to generate a digital data sample. The respective ADC sub-components can provide (e.g., communicate) the respective digital data samples to the combiner component 116, which can combine or integrate the respective digital data samples to generate a digital data stream. The combiner component 116 can send (e.g., communicate) the digital data stream to the decoder component 118. The decoder component 118 can decode the digital data stream, comprising the combined digital data samples from the respective ADC sub-components, to facilitate recovering (e.g., generating, determining, identifying, etc.) the data from the digital data samples.

In a proper link operation of the transceiver component 102, the transceiver component 102 (e.g., the receiver of the transceiver component 102) typically can make relatively few errors regarding the data that was received in the signal from the remote transmitter component 104. Since the recovered data determined by the transceiver component 102 typically can be correct or at least substantially and reliably correct, once the remotely transmitted data is recovered at the transceiver component 102, the recovered data can be used to facilitate determining the transfer characteristics of the communication channel or medium between the remote transmitter component 104 and the transceiver component 102, and/or determining the respective transfer characteristics of the remote transmitter component 104 with respect to each of the ADC sub-components (e.g., 108, 110, 112, etc.) of the array.

To facilitate making such determinations and performing other operations, the transceiver component 102 can comprise calibration component 120 that can respectively calibrate or adjust respective ADC sub-components (e.g., 108, 110, 112, etc.) of the array and/or information or paths (e.g., ADC sub-paths) associated with the respective arrays to facilitate correcting or mitigating the respective sub-ADC path differences associated with the respective ADC sub-components to facilitate mitigating distortions that would otherwise have been caused as a result of the uncorrected or unmitigated path differences. The calibration component 120 can calibrate or adjust the respective ADC sub-components (e.g., 108, 110, 112, etc.) of the array to facilitate correcting or mitigating sub-ADC path differences. The calibration component 120 can perform such calibration or adjustment of the ADC sub-components (e.g., 108, 110, 112, etc.) at virtually any desired time, such as, for example, during start-up of the ADC component 106 or associated device (e.g., transceiver component 102), during showtime, during or in connection with a data transfer associated with the transceiver component 102, periodically, in response to occurrence of a condition (e.g., in response to detection of a condition) associated with the transceiver component 102, the ADC component 106, or other component, and/or at another desired time.

In some implementations, the calibration component 120 can determine transfer characteristics of the communication channel or medium between the transceiver component 102 and the remote transmitter component 104, and the transfer characteristics of the remote transmitter component 104 with respect to each of the respective ADC sub-components (e.g., 108, 110, 112, etc.) of the array, based at least in part on an analysis of the recovered data by the calibration component 120. For instance, the calibration component 120 can operate to determine the respective transfer characteristics because the digital data stream that is output by a particular ADC sub-component can be a function of the remotely transmitted data and the channel characteristics of the sub-ADC path associated with that particular ADC sub-component. For each ADC sub-component (e.g., 108, 110, 112, etc.) of the array, the calibration component 120 also can know the samples of the received signals that come from a specific ADC sub-component of the array and the remotely transmitted data (e.g., received by the specific ADC sub-component) used to generate those samples.

Based at least in part on knowing the samples for the specific ADC sub-component and the remotely transmitted data used to generate those samples, the calibration component 120 can determine the transfer function associated with the specific ADC sub-component, for example, using channel estimation. The calibration component 120 can employ any of a number of channel estimation techniques to facilitate determining the transfer function associated with the specific ADC sub-component. For example, the calibration component 120 can use a least-squares channel estimation technique, a data cross-correlation technique, an iterative channel estimation technique (e.g., least-mean-square (LMS) channel estimation, recursive least squares (RLS) channel estimation, etc.), blind channel estimation, or another desired channel estimation technique, to facilitate determining the transfer function associated with a specific ADC sub-component of the array.

Based at least in part on the respective transfer characteristics (e.g., transfer functions) of each ADC sub-component (e.g., 108, 110, 112, etc.) of the array, the calibration component 120 can determine the respective path differences (e.g., sub-ADC processing path differences) associated with the respective ADC sub-components (e.g., 108, 110, 112, etc.). In accordance with various implementations, the calibration component 120 can determine or estimate the respective path differences (e.g., sub-ADC processing path differences) associated with the respective ADC sub-components (e.g., 108, 110, 112, etc.) using information that the calibration component 120 can obtain from the output of an equalizer (e.g., output of an equalizer component or an equalization filter component) or the decoder component 118 of the transceiver component 102. For instance, with regard to the decoder output, the calibration component 120 can use information of or relating to an error correction code introduced by the remote transmitter component 104 that sent the data to the transceiver component 102. For example, the calibration component 120 can facilitate determining or estimating the respective transfer characteristics or transfer functions of each ADC sub-component (e.g., 108, 110, 112, etc.) of the array based at least in part on information obtained from the output of the equalizer or decoder component 118 of the transceiver component 102.

The calibration component 120 also can determine respective calibrations or corrections that can be used to calibrate or correct the respective ADC sub-components (e.g., 108, 110, 112, etc.) based at least in part on the respective path differences associated with the respective ADC sub-components (e.g., 108, 110, 112, etc.). For instance, the calibration component 120 can analyze the respective path differences associated with the respective ADC sub-components (e.g., 108, 110, 112, etc.) and can determine calibrations, adjustments, or corrections that can be performed or made on the respective ADC sub-components (e.g., 108, 110, 112, etc.) to facilitate equalizing or substantially equalizing the respective sub-ADC paths associated with the respective ADC sub-components (e.g., 108, 110, 112, etc.) and/or reducing or mitigating the differences between the respective sub-ADC paths associated with the respective ADC sub-components (e.g., 108, 110, 112, etc.).

The calibration component 120 can calibrate or adjust the respective ADC sub-components (e.g., 108, 110, 112, etc.) of the array to facilitate correcting or mitigating the respective sub-ADC path differences associated with the respective ADC sub-components, based at least in part on the respective transfer characteristics or transfer functions, to facilitate mitigating distortions that would otherwise have been caused as a result of the uncorrected or unmitigated path differences. For instance, using the respective calibration or correction information determined by the calibration component 120 for the respective ADC sub-components (e.g., 108, 110, 112, etc.), the calibration component 120 can calibrate or adjust the respective ADC sub-components (e.g., 108, 110, 112, etc.) of the array to facilitate correcting or mitigating the respective sub-ADC path differences to facilitate mitigating path-difference-related distortions.

The respective ADC sub-components (e.g., 108, 110, 112, etc.) of the array, as calibrated or adjusted by the calibration component 120, can facilitate providing, as an output, respective digital data substreams that can correspond to the received analog signal. The combiner component 116 can receive the digital data substreams and can combine, integrate, or deinterleave the respective digital data substreams of the respective ADC sub-components (e.g., 108, 110, 112, etc.) to generate, at a desirably high speed, a digital data stream that can accurately represent the data contained in the received analog signal.

In some implementations, the calibration component 120 can perform channel estimation, using a desired channel estimation technique, to estimate or determine the channel for an ADC sub-component(s) (e.g., 108, 110, 112, etc.) over a relatively larger bandwidth or sampling frequency than the nominal ADC sampling frequency or bandwidth associated with the ADC sub-component(s) (e.g., 108, 110, 112, etc.). The calibration component 120 can perform such channel estimation in part by measuring the channel response of each of the ADC sub-component(s) (e.g., 108, 110, 112, etc.) using a desired number (e.g., 2 or more) sampling offsets. For example, if the calibration component 120 measures, and estimates or determines, an ADC sub-component's channel with a timing offset of a defined first offset value (e.g., 0), e.g., as intentionally introduced by the calibration component 120, and measures, and estimates or determines, the ADC sub-component's channel with a timing offset of a defined second offset value (e.g., T/2, wherein T can be the sample timing associated with the ADC component 106), the calibration component 120 can reconstruct or determine that ADC sub-component's channel for a sampling timing of the defined second offset value (e.g., T/2), instead of for the sampling timing (e.g., T) of the ADC component 106, and, correspondingly, can know, learn, or determine the ADC sub-component's channel to a positive bandwidth of 1/T instead of ½T. The calibration component 120 can use the channel information derived or determined from measuring each of the ADC sub-components' channels through such oversampling to enable the calibration component 120 to have a more accurate determination of the path processing differences between respective ADC sub-components (e.g., 108, 110, 112, etc.) of the array, as the calibration component 120 can now have the path information associated for the respective ADC sub-components (e.g., 108, 110, 112, etc.) at a higher sampling rate than the nominal sampling rate associated with the ADC component 106.

In other implementations, the calibration component 120 can incorporate clock recovery into the path correction algorithm associated with an ADC sub-component (e.g., 108, 110, 112, etc.), wherein the calibration component 120 can perform a timing-recovery computation (e.g., can determine a timing recovery) for each ADC sub-component (e.g., 108, 110, 112, etc.) of the array, which can result in all of the ADC sub-components (e.g., 108, 110, 112, etc.) of the array approaching each other from a path difference perspective to result in the same or substantially the same recovered phase, and, hence, equalizing or at least substantially equalizing respective sub-ADC path delays associated with the respective ADC sub-components (e.g., 108, 110, 112, etc.). This can facilitate correction of path differences between the respective ADC sub-components (e.g., 108, 110, 112, etc.) and reduction of distortion in the combined digital data stream produced by the ADC component 106 from the respective digital data substreams produced by the respective ADC sub-components (e.g., 108, 110, 112, etc.).

The calibration component 120 also can determine or derive sub-ADC timing differences of the respective ADC sub-components (e.g., 108, 110, 112, etc.) of the array from determinations or computations performed by the calibration component 120 for timing recovery (e.g., general timing-recovery) or synchronization (e.g., for a synchronization system) being implemented by or at the transceiver component 102. For example, the calibration component 120 can determine or select data from a general timing-recovery block that can correspond to the particular ADC sub-component(s) (e.g., 108, 110, or 112) for which correction is desired, and the calibration component 120 can use such data relating to the general timing-recovery block to facilitate determining or deriving sub-ADC timing differences of the respective ADC sub-components (e.g., 108, 110, 112, etc.) of the array. The calibration component 120 can use information relating to the sub-ADC timing differences of the respective ADC sub-components (e.g., 108, 110, 112, etc.) of the array to facilitate determining calibrations, adjustments, or corrections that are to be performed on the respective ADC sub-components (e.g., 108, 110, 112, etc.) to facilitate equalizing or substantially equalizing the respective sub-ADC paths associated with the respective ADC sub-components (e.g., 108, 110, 112, etc.) and/or reducing or mitigating the differences between the respective sub-ADC paths associated with the respective ADC sub-components (e.g., 108, 110, 112, etc.).

In accordance with still other implementations, the calibration component 120 can modify or adjust a timing offset(s) associated with an ADC sub-component(s) until all of the ADC sub-components (e.g., 108, 110, 112, etc.) have the same or at least substantially the same channel transfer function. By doing this, the calibration component 120 can equalize respective sub-ADC path delays of the respective ADC sub-components (e.g., 108, 110, 112, etc.) without the calibration component 120 having to perform additional computations (and having to use additional resources).

In some implementations, the calibration component 120 can use the information of the estimated or determined channels of each ADC sub-component (e.g., 108, 110, 112, etc.) to facilitate configuring a correction filter, such as, for example, a sub-ADC path digital correction filter, that can used to facilitate processing each sub-ADC signal to equalize path differences between the respective ADC sub-components (e.g., 108, 110, 112, etc.). The calibration component 120 can configure the sub-ADC path correction digital filter using iterative/adaptive techniques or using direct computation. In certain implementations, the calibration component 120 can employ a correction filter that can be an analog filter, wherein the calibration component 120 can facilitate controlling or configuring the analog correction filter, based at least in part on the information of the estimated or determined channels of each ADC sub-component (e.g., 108, 110, 112, etc.), to facilitate processing each sub-ADC signal to equalize path differences between the respective ADC sub-components (e.g., 108, 110, 112, etc.).

In still other implementations, the calibration component 120 can determine (e.g., calculate, compute) a function of the estimated sub-ADC channel for each ADC sub-component (e.g., 108, 110, 112, etc.), wherein the calibration component 120 can use the function associated with a ADC sub-component as a metric by which the sub-ADC channel delays associated with that ADC sub-component can be equalized. For example, the calibration component 120 can determine or compute the responses of a set of desired multi-tap responses, such as, e.g., a set of the largest 2-taps, for all of the ADC sub-components (e.g., 108, 110, 112, etc.) of the array. The calibration component 120 can compare the multi-tap responses across all of the ADC sub-components (e.g., 108, 110, 112, etc.) of the array. The calibration component 120 can execute an algorithm (e.g., a multi-tap response adjustment algorithm) to facilitate adjusting one or more functions, parameters, or control mechanisms associated with the respective multi-tap responses associated with the respective ADC sub-components (e.g., 108, 110, 112, etc.) to facilitate causing the respective multi-tap responses to be the same or at least substantially the same (e.g., can have the same or substantially the same values) for all of the ADC sub-components (e.g., 108, 110, 112, etc.), which can indicate that the respective sub-ADC paths can be made the same. For example, the calibration component 120 can adjust a function(s), parameter(s), or control mechanism(s), such as a sampling time(s) associated with a ADC sub-component(s) (e.g., using a delay line), or a sub-ADC correction filter (e.g., sub-ADC digital correction filter), etc., to facilitate causing the respective multi-tap responses to be the same or at least substantially the same for all of the ADC sub-components (e.g., 108, 110, 112, etc.). The algorithm can be iterative, for example, and the calibration component 120 can execute the algorithm to facilitate adjusting respective sub-ADC paths, either digitally or in analog, to make the respective sub-ADC paths the same or at least substantially the same. The calibration component 120 also can execute the algorithm to facilitate configuring the respective sub-ADC paths to reduce or minimize the differences between the respective multi-tap responses. Employing the algorithm, the calibration component 120 can facilitate reducing distortion in the combined digital data stream produced by the ADC component 106 from the respective portions of the digital data stream produced by the respective ADC sub-components (e.g., 108, 110, 112, etc.).

Figure 2:
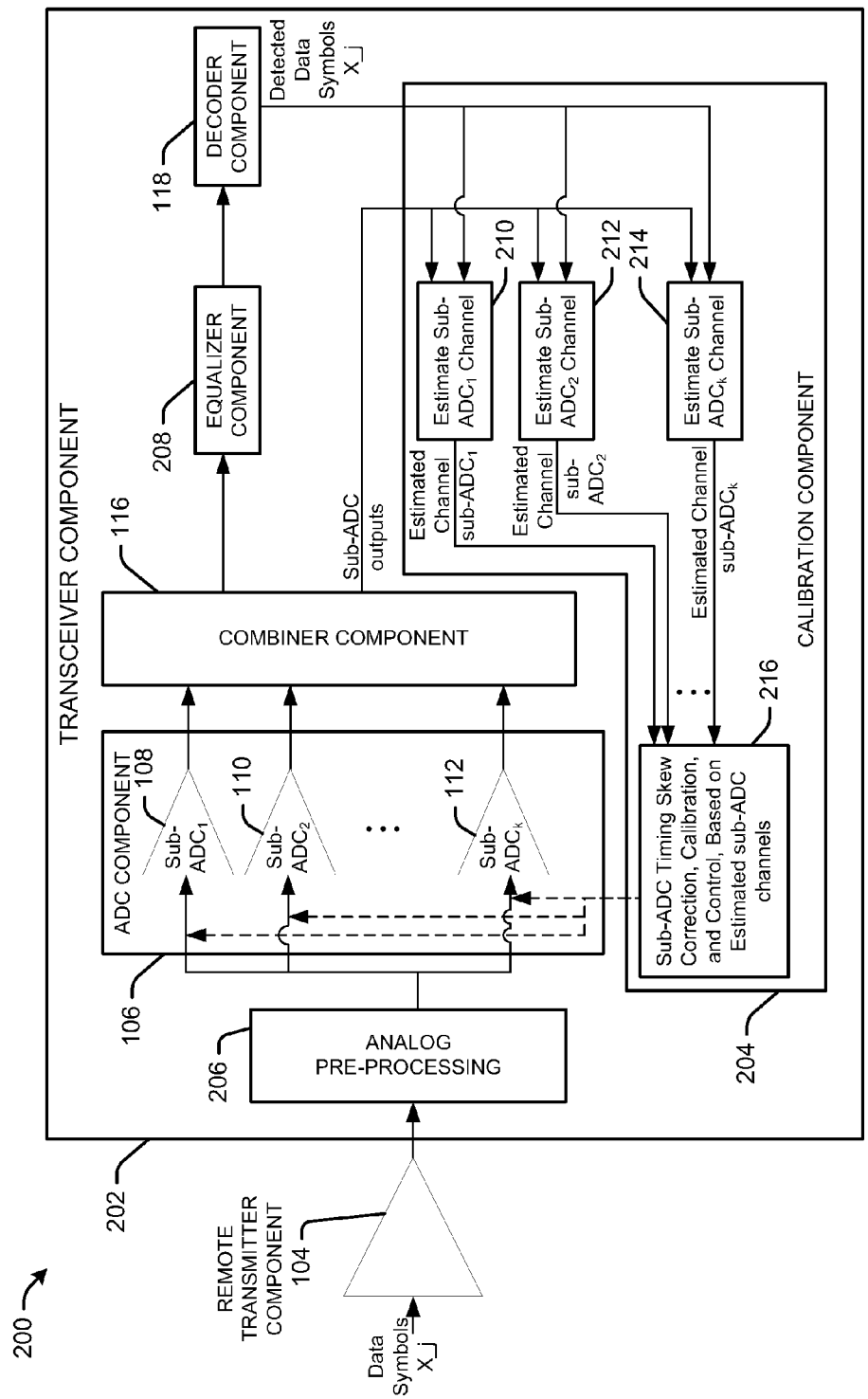
FIG. 2 depicts a diagram of an example, non-limiting embodiment of a system that can facilitate calibrating sub-ADCs of an array of sub-ADCs of a transceiver component to facilitate correcting or mitigating sub-ADC path differences, in accordance with various aspects and embodiments of the disclosed subject matter.

Referring to FIG. 2 (along with FIG. 1), FIG. 2 depicts a diagram of an example, non-limiting embodiment of a system 200 that can facilitate calibrating sub-ADCs of an array of sub-ADCs of a transceiver component to facilitate correcting or mitigating sub-ADC path differences, in accordance with various aspects and embodiments of the disclosed subject matter. The system 200 can comprise transceiver component 202, the remote transmitter component 104, the ADC component 106, the interleaver component 114, the combiner component 116, the decoder component 118, and the calibration component 204. The ADC component 106 can comprise a set of ADC sub-components, comprising ADC sub-component$_1$ 108 (sub-adc$_1$), ADC sub-component$_2$ 110 (sub-adc$_2$), up through ADC sub-component$_k$ 112 (sub-adc$_k$).

The remote transmitter component 104 can process and communicate analog signals, comprising a set of symbols X_J (e.g., data symbols), to the transceiver component 202, wherein the analog signals (e.g., encoded analog signals) can comprise or represent voice or data traffic that can represent the voice or data being communicated by the remote transmitter component 104. The transceiver component 202 can receive the analog signals, comprising the voice or data traffic, from the remote transmitter component 104.

The transceiver component 202 can perform analog pre-processing 206 on the analog signals to facilitate converting the analog signals to digital signals and performing other processing on the received analog signals. In some implementations, the interleaver component 114 can process an analog signal to generate respective time-delayed analog signals of the analog signal, wherein the respectively time-delayed analog signals can be provided to the respective ADC sub-components (e.g., 108, 110, 112, etc.) of the ADC component 106.

The respective ADC sub-components (e.g., 108, 110, 112, etc.) can process the respective time-delayed analog signals to convert those respective time-delayed analog signals to respective digital signals. The respective ADC sub-components (e.g., 108, 110, 112, etc.) can provide (e.g., communicate) the respective digital signals to the combiner component 116, and the combiner component 116 can combine or integrate the respective digital signals (e.g., respective digital data sub-streams) to generate a digital data stream (e.g., an integrated digital data stream).

The system 200 also can include an equalizer component 208 that can receive the digital data stream from the combiner component 116. The equalizer component 208 can analyze and process the digital data stream to facilitate equalizing the digital data stream and/or performing other digital signal processing or filtering on the digital data stream. For example, the equalizer component 208 can utilize one or more equalization techniques (e.g., digital signal processing (DSP) techniques, adaptive equalization techniques, filtering techniques, etc.) or other processing techniques to facilitate processing the received digital data stream.

The digital data stream, as processed by the equalizer component 208, can be provided (e.g., communicated) to the decoder component 118. The decoder component 118 can decode the processed digital data stream received from the equalizer component 208 to determine, generate, or recover the data (e.g., voice or other data) contained within the digital data stream. For instance, the digital data stream can comprise digital data samples output from the respective ADC sub-components (e.g., 108, 110, 112, etc.), as processed by the equalizer component 208. The decoder component 118 can decode the respective digital data samples (e.g., decode the encoded symbols in the digital data samples) to facilitate recovering (e.g., generating, determining, identifying, etc.) the data from the digital data samples. The recovered data can be, for example, data symbols (e.g., X_j) that are determined or identified by the decoder component 118 during decoding of the digital data stream.

The calibration component 204 can detect or receive the decoded output (e.g., the decoded data symbols, X_j) from the decoder component 118. The calibration component also can detect or receive the respective digital signals (e.g., the sub-ADC outputs, which can be digital data substreams) from the respective ADC sub-components (e.g., 108, 110, 112, etc.). The calibration component 204 can analyze the respective digital signals associated with the original analog signal and the recovered data (e.g., decoded data) to facilitate calibrating the respective ADC sub-components (e.g., 108, 110, 112, etc.) of the sub-ADC array to facilitate correcting or mitigating sub-ADC path differences.

In some implementations, the calibration component 204 can perform channel estimation on each of the respective ADC sub-components (e.g., 108, 110, 112, etc.) to estimate or determine the respective channels for the respective ADC sub-components (e.g., 108, 110, 112, etc.) using a desired channel estimation technique (e.g., a least-squares channel estimation technique, a data cross-correlation technique, an iterative channel estimation technique (e.g., LMS channel estimation, RLS channel estimation, etc.), blind channel estimation, or another desired channel estimation technique), to facilitate determining the respective transfer functions associated with respective ADC sub-components (e.g., 108, 110, 112, etc.) of the sub-ADC array. For example, using a desired channel estimation technique, the calibration component 204 can perform channel estimation in connection with ADC sub-component$_1$ 108 (sub-adc$_1$) to estimate or determine the channel for ADC sub-component$_1$ 108 (as depicted at 210) based at least in part on (e.g., as a function of) the digital data samples output from the ADC sub-component$_1$ 108 and the recovered data (e.g., the decoded data symbols, X_j) detected from the decoder component 118. Using the desired channel estimation technique, the calibration component 204 also can perform channel estimation in connection with ADC sub-component$_2$ 110 (sub-adc$_2$) to estimate or determine the channel for ADC sub-component$_2$ 110 (as depicted at 212) based at least in part on (e.g., as a function of) the digital data samples output from the ADC sub-component$_2$ 110 and the recovered data detected from the decoder component 118. Further, using the desired channel estimation technique, the calibration component 204 can perform channel estimation in connection with ADC sub-component$_k$ 112 (sub-adc$_k$) to estimate or determine the channel for ADC sub-component$_k$ 112 (as depicted at 214) based at least in part on (e.g., as a function of) the digital data samples output from the ADC sub-component$_k$ 112 and the recovered data detected from the decoder component 118.

The calibration component 204 can analyze the respective channel estimations (e.g., estimated channel for sub-ADC$_1$, estimated channel for sub-ADC$_2$, and/or (up through) estimated channel for sub-ADC$_k$) to facilitate determining the respective transfer functions of the respective ADC sub-components (e.g., 108, 110, 112, etc.) to facilitate calibrating the respective ADC sub-components to facilitate correcting or mitigating sub-ADC path differences between the respective ADC sub-components. Based at least in part on the results of the analysis of the respective channel estimations, the calibration component 204 can determine the calibration(s) to employ on, or with respect to, the respective ADC sub-components (e.g., 108, 110, 112, etc.) to facilitate calibrating the respective ADC sub-components to facilitate correcting or mitigating the sub-ADC path differences. For example, the calibration component 204 can determine a sub-ADC timing skew correction (as depicted at 216) and/or other type(s) of calibration, and can generate a corresponding correction or calibration function(s) or control(s) that can be applied to all or a portion of the respective ADC sub-components (e.g., 108, 110, 112, etc.) or respective data paths (e.g., input data paths) of the respective ADC sub-components to facilitate calibrating the respective ADC sub-components and correcting or mitigating the sub-ADC path differences, based at least in part on the respective channel estimations (e.g., estimated channel for sub-ADC$_1$, estimated channel for sub-ADC$_2$, and/or (up through) estimated channel for sub-ADC$_k$) of the respective ADC sub-components (e.g., 108, 110, 112, etc.), in accordance with the defined path correction criteria.

The calibration component 204 can facilitate applying the respective correction or calibration function(s) or control(s) to all or a desired portion of the respective ADC sub-components (e.g., 108, 110, 112, etc.) or the respective data paths (e.g., input data paths) of the respective ADC sub-components to facilitate calibrating the respective ADC sub-components and correcting or mitigating the sub-ADC path differences. The sub-ADC path differences between the respective ADC sub-components (e.g., 108, 110, 112, etc.) can be reduced, minimized, or eliminated in response to the application of the respective correction or calibration function(s) or control(s) to all or the desired portion of the respective ADC sub-components (e.g., 108, 110, 112, etc.) or the respective data paths (e.g., input data paths) of the respective ADC sub-components.

Figure 3:
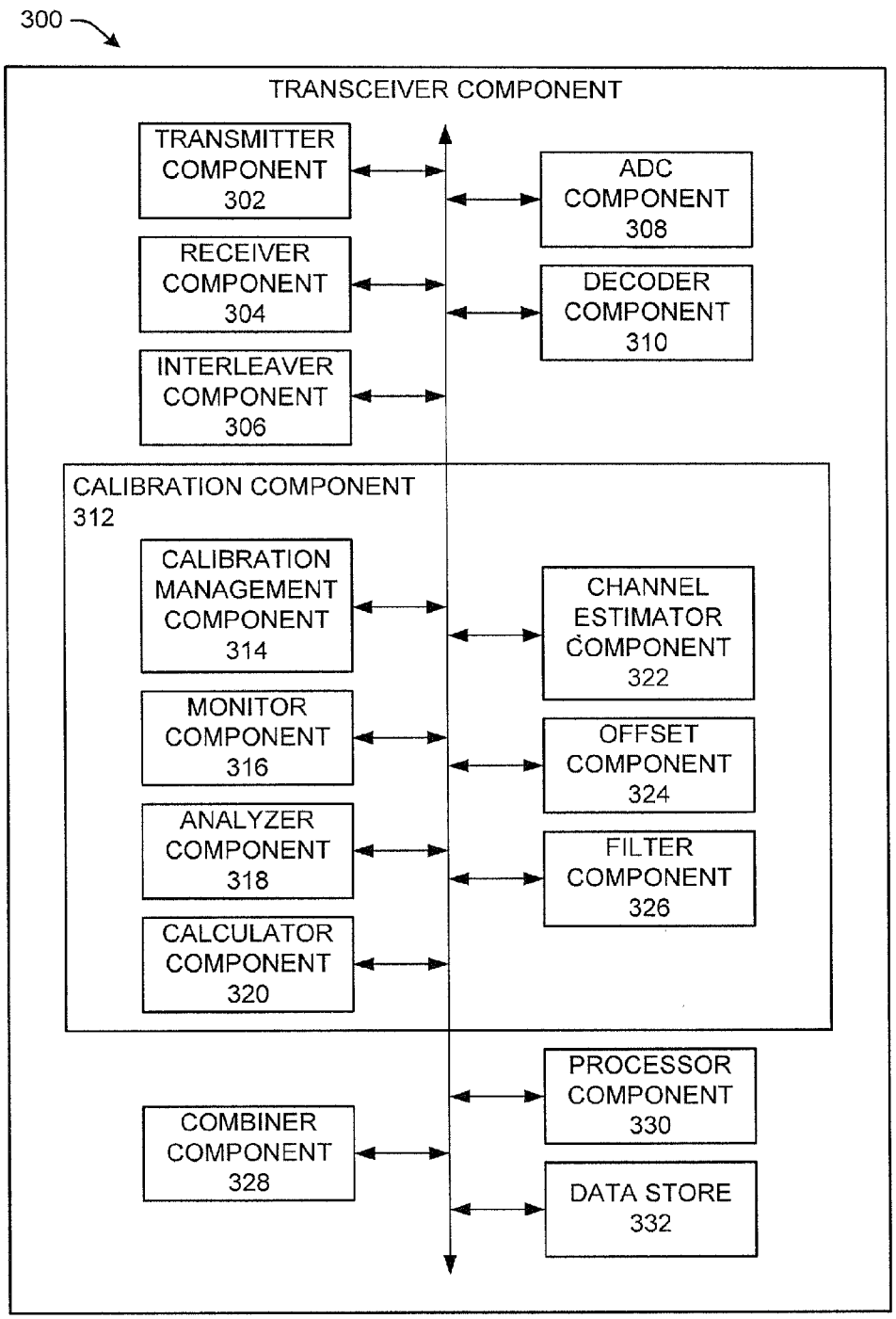
FIG. 3 illustrates a block diagram of an example, non-limiting embodiment of a transceiver component, in accordance with various aspects and embodiments of the disclosed subject matter.

FIG. 3 illustrates a block diagram of an example, non-limiting embodiment of a transceiver component 300, in accordance with various aspects and embodiments of the disclosed subject matter. The transceiver component 300 can be used to transmit or receive voice or data communications. In some implementations, the transceiver component 300 can be a full-duplex transceiver The transceiver component 300 can comprise a transmitter component 302 that can comprise one or more transmitter sub-components (e.g., transmitters) that can facilitate transmitting voice information or data from the transceiver component 300 to a communication device that is communicatively connected to the transceiver component 300 via a wireline, optical, or wireless communication connection (e.g., communication channel). In some implementations, the transmitter component 302 can include, for example, a plurality (e.g., 2, 3, 4, . . . ) of transmitter sub-components.

The transceiver component 300 also can comprise a receiver component 304 that can comprise one or more receiver sub-components (e.g., receivers) that can facilitate receiving voice information or data from a communication device that is communicatively connected to the transceiver component 300 via a wireline, optical, or wireless communication connection (e.g., communication channel). In some implementations, the receiver component 304 can include, for example, a plurality (e.g., 2, 3, 4, . . . ) of receiver sub-components.

The transceiver also can comprise an interleaver component 306 that can be employed to interleave a received analog signal across the respective interleaved ADC sub-components of a sub-ADC array of the ADC component 308. In some implementations, the interleaver component 306 (or the calibration component 312) can process the analog signal to implement or introduce respective time delays to the analog signal to generate time-delayed analog signals (e.g., having respective time delays) prior to the signal being input to the ADC component 308.

The transceiver component 300 can include an ADC component 308 that can comprise a set of ADC sub-components that can be arranged or configured in an interleaved structure to facilitate converting analog signals to digital signals, as more fully disclosed herein. The respective ADC sub-components of the ADC component 308 can receive respective analog signals (e.g., respectively time-delayed analog signals) in connection with an analog signal received from a remote communication device, can sample (e.g., using a sample component(s)) the respective analog signals, and can convert or digitize (e.g., via a converter or digitizer component(s)) the respective analog signals to respective digital data samples that can have digital values that can correspond to the respective analog signals (e.g., can correspond to the analog values of the analog signal samples).

The transceiver component 300 also can comprise a decoder component 310 that can decode and/or error correct the digital data stream, comprising the combined or integrated digital data samples of digital data substreams output from the ADC sub-components of the ADC component 308, to facilitate determining or recovering the data (e.g., determining the data values of data) that was sent in the analog signal to the transceiver component 300, in accordance with a desired decoding and/or error correction techniques. The decoder component 310 can employ, for example, a Reed-Solomon algorithm, a Hamming code, a Bose, Ray-Chaudhuri, Hocquenghem (BCH) algorithm, a forward error correction (FEC) algorithm, or other decoding algorithm or error correction algorithm, etc., to facilitate decoding and/or correcting errors associated with the respective digital data samples of the digital data substreams to facilitate determining or recovering the data of the analog signal.

The transceiver component 300 further can comprise a calibration component 312 that can respectively calibrate or adjust respective ADC sub-components of the ADC component 308 and/or information or paths (e.g., ADC sub-paths) associated with the respective arrays to facilitate correcting or mitigating the respective sub-ADC path differences associated with the respective ADC sub-components to facilitate mitigating distortions that would otherwise have been caused as a result of the uncorrected or unmitigated path differences. In accordance with various aspects and implementations, the calibration component 312 can comprise, for example, a calibration management component 314, a monitor component 316, an analyzer component 318, a calculator component 320, a channel estimator component 322, an offset component 324, and a filter component 326.

The calibration management component 314 can control or manage operations of the various components (e.g., monitor component 316, analyzer component 318, calculator component 320, etc.) of the calibration management component 314, data flow between the various components of the calibration management component 314, data between the calibration management component 314 and other components (e.g., the ADC component 308, the decoder component 310, the processor component 330, the data store 332, etc.), and/or other operations of or associated with the calibration management component 314. Employing the various components of the calibration management component 314, the calibration management component 314 can respectively calibrate or adjust the respective ADC sub-components of the ADC component 308 and/or information or paths (e.g., ADC sub-paths) associated with the respective arrays to facilitate correcting or mitigating the respective sub-ADC path differences (e.g., equalizing or substantially equalizing the respective sub-ADC paths) associated with the respective ADC sub-components, as more fully disclosed herein.

The monitor component 316 can monitor, sense, or detect information, such as information relating to communication conditions, information relating to transfer characteristics, etc., associated with the transceiver component 300. For instance, the monitor component 316 can monitor, sense, or detect information relating to the transfer characteristics of the communication channel or medium between the transceiver component 300 and another communication device (e.g., a remote transmitting device), based at least in part on the recovered data from the signal. The monitor component 316 also can monitor, sense, or detect information relating to the transfer characteristics of the other communication device to each of the ADC sub-components of the ADC component 308, based at least in part on the recovered data from the signal.

The analyzer component 318 can analyze, evaluate, or compare data associated with the transceiver component 300 to facilitate calibrating or adjusting the respective ADC sub-components of the ADC component 308 and/or information or paths (e.g., ADC sub-paths) associated with the respective arrays to facilitate correcting or mitigating the respective sub-ADC path differences (e.g., equalizing or substantially equalizing the respective sub-ADC paths) associated with the respective ADC sub-components. The data that can be analyzed by the analyzer component 318 can relate to recovered data (e.g., digital data) associated with a received analog signal, various types of transfer characteristics (e.g., as more fully disclosed herein), information relating to channel estimation or channel responses, information resulting from calculations performed by the calculator component 320, information relating to respective transfer functions associated with respective ADC sub-components, information relating to respective path differences between respective ADC sub-components, and/or other information relating to calibration of the ADC sub-components. Based at least in part on the data analysis, the analyzer component 318 can generate analysis results that can be used by the calibration management component 314 to facilitate making determinations relating to calibration or adjustment of the respective ADC sub-components of the ADC component 308 and/or information or paths (e.g., ADC sub-paths) associated with the respective arrays to facilitate correcting or mitigating the respective sub-ADC path differences associated with the respective ADC sub-components.

The calculator component 320 can perform calculations (e.g., mathematical calculations) on data values using equations, including the equations disclosed herein, and/or matrices, to generate calculation results. The calibration management component 314 can use the calculation results to facilitate calibrating or adjusting the respective ADC sub-components of the ADC component 308 and/or information or paths (e.g., ADC sub-paths) associated with the respective arrays to facilitate correcting or mitigating the respective sub-ADC path differences associated with the respective ADC sub-components.

The channel estimator component 322 can perform channel estimations or determinations to facilitate determining respective transfer functions associated with respective ADC sub-components of the ADC component 308, for example, using a desired channel estimation technique. The channel estimator component 322 can employ any of a number of channel estimation techniques to facilitate determining such transfer functions. For example, the channel estimator component 322 can use a least-squares channel estimation technique, a data cross-correlation technique, an iterative channel estimation technique (e.g., LMS channel estimation, RLS channel estimation, blind channel estimation, etc.), or another desired channel estimation technique, to facilitate determining such transfer functions.

The offset component 324 can be employed to implement or introduce one or more offsets, such as timing offsets, to facilitate measuring, determining, or estimating respective channel responses (e.g., by the channel estimator component 322) of respective sub-ADC paths at the one or more offsets. As more fully disclosed herein, this can facilitate more accurately reconstructing the channel for each of the ADC sub-components of the ADC component 308 over a more refined time period (e.g., as a result of the oversampling facilitated by the offsets). The offset component 324 also can be used by the calibration management component 314 to facilitate adjusting a timing offset(s) to facilitate adjusting respective transfer functions of respective ADC sub-components until the respective transfer functions of the respective ADC sub-components are the same or at least substantially the same, in accordance with the defined path correction criteria.

The filter component 326 can comprise one or more analog or digital filters that can filter or process information, such as analog signals (e.g., analog data samples) or digital signals (e.g., digital data samples), to facilitate equalizing or at least substantially equalizing sub-ADC path differences between respective ADC sub-components of the ADC component 308. The filter component 326 can facilitate configuring a filter(s) (e.g., an analog correction filter or a digital correction filter) based at least in part on information relating to estimated or determined channel responses of each ADC sub-component of the ADC component 308. The filter component 326 can use the configured filter(s) to facilitate processing respective sub-ADC signals of the respective ADC sub-components to facilitate equalizing or at least substantially equalizing path differences between the respective ADC sub-components of the ADC component 308. In accordance with implementations, the filter component 326 can configure a filter (e.g., a sub-ADC path correction digital filter) using iterative or adaptive techniques, or using direct computation (e.g., as facilitated by the calculator component 320). In certain implementations, the filter component 326 can employ a correction filter that can be an analog filter, wherein the calibration management component 314 can facilitate controlling or configuring the analog correction filter, based at least in part on the information of the estimated or determined channel responses of the respective ADC sub-components, to facilitate processing the respective sub-ADC signals to facilitate equalizing or at least substantially equalizing path differences between the respective ADC sub-components of the ADC component 308.

The transceiver component 300 also can comprise a combiner component 328 that can combine, integrate, or deinterleave the respective digital data substreams of the respective sub-ADCs of the ADC component 308 to generate a digital data stream that can accurately represent the data contained in the received analog signal, as more fully disclosed herein. The combiner component 328 can be associated with (e.g., communicatively connected to) the ADC component 308 to facilitate receiving the digital data substreams from the ADC sub-components of the ADC component 308. The combiner component 328 also can be associated with the calibration component 312 to facilitate providing the respective digital data substreams (e.g., respective digital data samples) to the calibration component 312 for analysis by the calibration component 312 to facilitate calibrating or adjusting the respective ADC sub-components of the ADC component 308 and/or information or paths (e.g., ADC sub-paths) associated with the respective arrays to facilitate correcting or mitigating the respective sub-ADC path differences (e.g., equalizing or substantially equalizing the respective sub-ADC paths) associated with the respective ADC sub-components.

The transceiver component 300 also can comprise a processor component 330 that can operate in conjunction with the other components (e.g., transmitter component 302, receiver component 304, interleaver component 306, ADC component 308, decoder component 310, calibration component 312, etc.) to facilitate performing the various functions of the transceiver component 300, such as disclosed herein. The processor component 330 can employ one or more processors (e.g., central processing units (CPUs), graphical processing units (GPUs), field-programmable gate arrays (FPGAs), etc.), microprocessors, or controllers that can process data, such as information (e.g., voice or data information) relating to operations performed by the transceiver component 300, etc., to facilitate transmitting signals, receiving signals, calibrating or adjusting ADC sub-components, calibrating or adjusting information or paths associated with ADC sub-components, performing channel estimation, performing calculations, configuring filters, filtering signals, and/or performing other operations; and can control data flow between the transceiver component 300 and other components associated with (e.g., connected to) the transceiver component 300 and can control data flow between various components of the transceiver component 300.

In yet another aspect, the transceiver component 300 also can include a data store 332 that can store data structures (e.g., voice information, data, metadata); code structure(s) (e.g., modules, objects, classes, procedures), commands, or instructions; information relating to receiving signals, calibrating or adjusting ADC sub-components, calibrating or adjusting information or paths associated with ADC sub-components, performing channel estimation, performing calculations, configuring filters, filtering signals, and/or performing other operations; parameter data; information relating to algorithms (e.g., algorithm(s) relating to calibrating ADC sub-components, algorithm(s) relating to configuring an analog or digital filter, algorithm(s) relating to channel estimation, etc.); defined path correction criterion(s); and so on. In an aspect, the processor component 330 can be functionally coupled (e.g., through a memory bus) to the data store 332 in order to store and retrieve information desired to operate and/or confer functionality, at least in part, to the transmitter component 302, receiver component 304, interleaver component 306, ADC component 308, decoder component 310, calibration component 312, etc., and/or substantially any other operational aspects of the transceiver component 300. It is to be appreciated and understood that the various components of the transceiver component 300 can communicate information between each other and/or between other components associated with the transceiver component 300 as desired to carry out operations of the transceiver component 300. It is to be further appreciated and understood that respective components (e.g., transmitter component 302, receiver component 304, interleaver component 306, ADC component 308, decoder component 310, calibration component 312, etc.) of the transceiver component 300 each can be a stand-alone unit, can be included within the transceiver component 300 (as depicted), can be incorporated within another component of the transceiver component 300 or a component separate from the transceiver component 300, and/or virtually any suitable combination thereof, as desired.

In view of the example systems described above, methods that may be implemented in accordance with the described subject matter may be better appreciated with reference to the flow charts of FIGS. 4-10. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Figure 4:
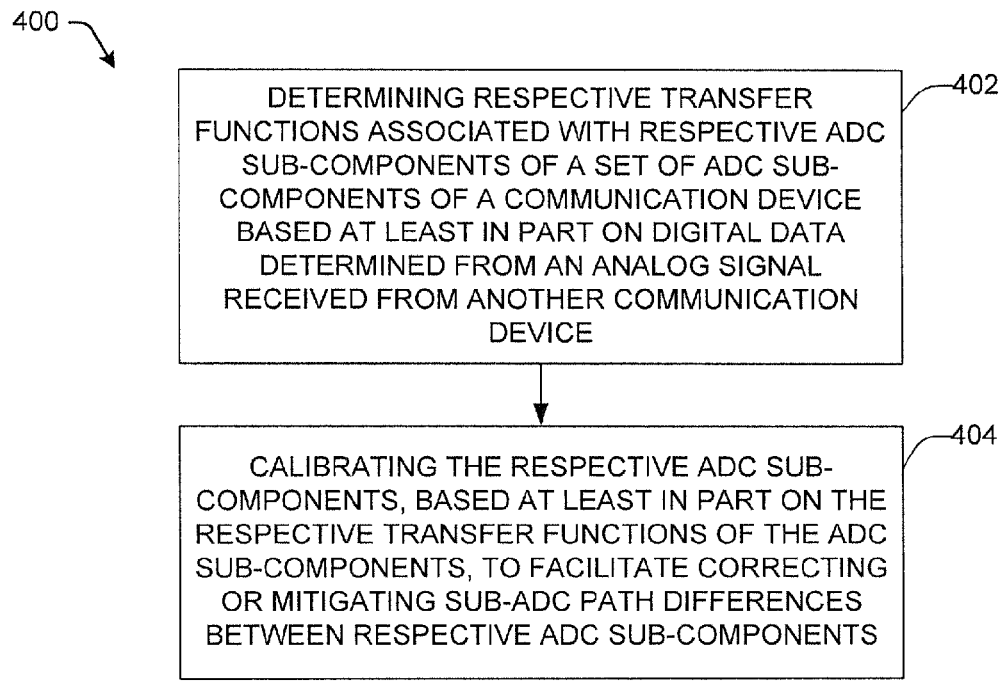
FIG. 4 illustrates a flow diagram of an example, non-limiting embodiment of a method that can facilitate calibrating sub-ADCs of an array of sub-ADCs of a transceiver component to facilitate correcting or mitigating sub-ADC path differences, in accordance with various aspects and embodiments of the disclosed subject matter.

FIG. 4 illustrates a flow diagram of an example method 400 that can facilitate calibrating sub-ADCs of an array of sub-ADCs of a transceiver component to facilitate correcting or mitigating sub-ADC path differences, in accordance with various aspects and embodiments of the disclosed subject matter. The method 400 can be implemented by a communication device, such as a transceiver component, which can comprise a calibration component and an ADC component, for example.

At block 402, respective transfer functions associated with respective ADC sub-components of a set (e.g., an array) of ADC sub-components of a communication device (e.g., a transceiver component) can be determined based at least in part on digital data determined from an analog signal received from another communication device. The communication device can receive an analog signal, comprising data, from the other communication device. The ADC sub-components of the ADC component, which can be interleaved, can sample and digitize the analog signal, wherein the respective ADC sub-components can receive the analog signal with respective time-delays. The data (e.g., digital data) can be recovered from the digitized data samples (e.g., after the digitized data samples are decoded by a decoder component).

The calibration component can determine the transfer characteristics of the communication channel or medium between the communication device and the other communication device (e.g., the transmitting device), based at least in part on the recovered data from the signal. The calibration component also can determine the transfer characteristics of the other communication device to each of the ADC sub-components of the set of ADC sub-components, based at least in part on the recovered data from the signal. The calibration component is able to make such determinations of the respective transfer characteristics because the output digital data substreams of the ADC sub-components can be a function of the remotely transmitted data (e.g., the data of the analog signal) and the channel characteristics of the respective sub-ADC paths of the ADC sub-components. For each ADC sub-component, the calibration component can know that the samples from the ADC sub-component and the remotely transmitted data from which the samples were generated. For each ADC sub-component, the calibration component can use channel estimation to facilitate determining the transfer function of the ADC sub-component, based at least in part on information relating to the samples from the ADC sub-component and the remotely transmitted data from which the samples were generated.

At block 404, the respective ADC sub-components can be calibrated, based at least in part on the respective transfer functions of the ADC sub-components, to facilitate correcting or mitigating sub-ADC path differences between respective ADC sub-components. The calibration component can calibrate or adjust the respective ADC sub-components of the set of ADC sub-components, based at least in part on the respective transfer functions of the ADC sub-components, to facilitate correcting or mitigating sub-ADC path differences between respective ADC sub-components to facilitate mitigating distortions in the digital data stream that would otherwise have be caused as a result of the uncorrected or unmitigated path differences. The communication device also can comprise a combiner component that can combine or integrate the respective digital data substreams from the respective ADC sub-components to generate a digital data stream that can correspond to the data from the received analog signal. As desired, the digital data stream can be further processed (e.g., using an equalizer component and/or decoder component) or can be provided (e.g., presented or displayed) as an output.

Figure 5:
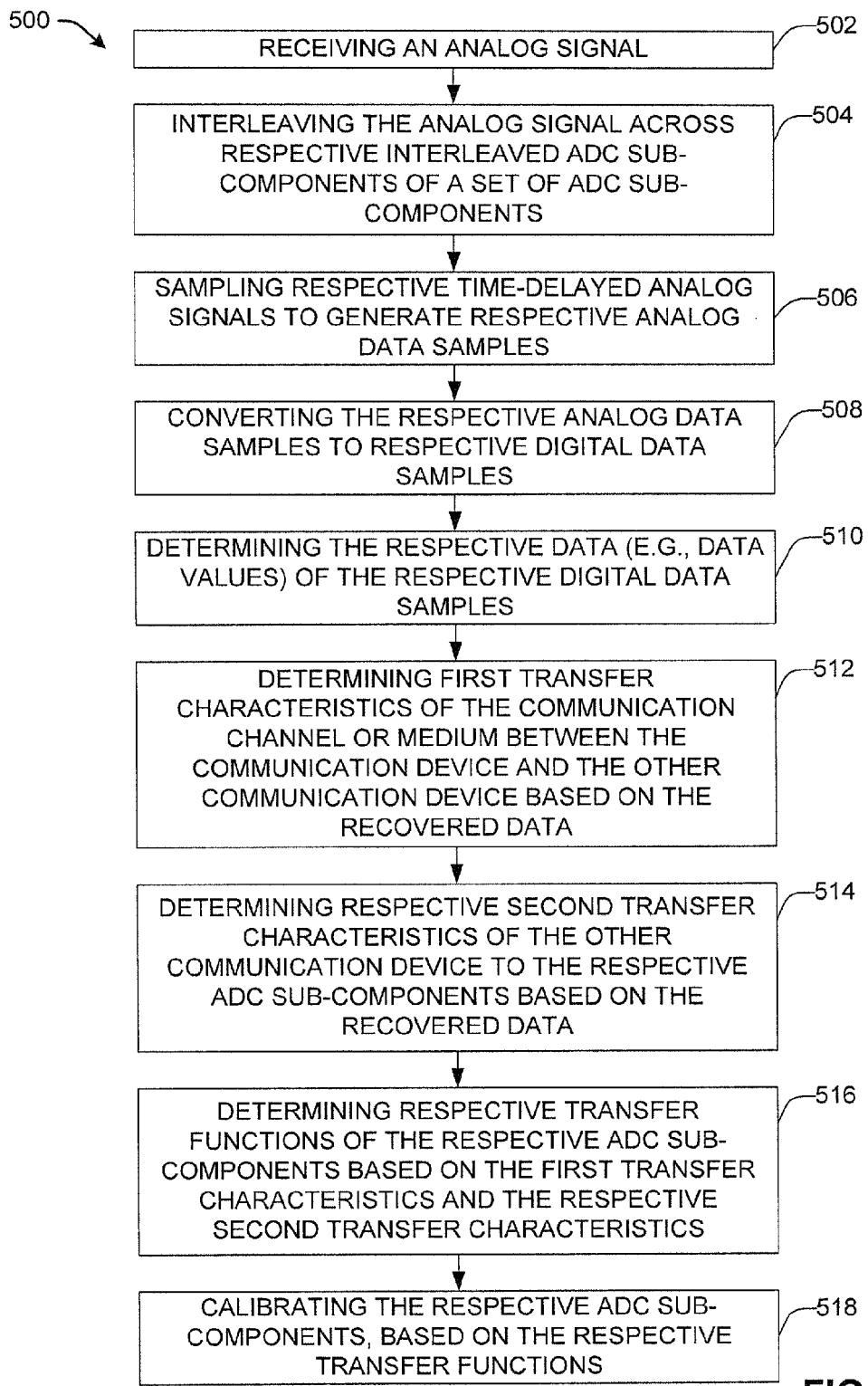
FIG. 5 depicts a flow diagram of another example, non-limiting embodiment of a method that can facilitate calibrating sub-ADCs of an array of sub-ADCs of a transceiver component to facilitate correcting or mitigating sub-ADC path differences, in accordance with various aspects and embodiments of the disclosed subject matter.

FIG. 5 depicts a flow diagram of another example method 500 that can facilitate calibrating sub-ADCs of an array of sub-ADCs of a transceiver component to facilitate correcting or mitigating sub-ADC path differences, in accordance with various aspects and embodiments of the disclosed subject matter. The method 500 can be implemented by a communication device, such as a transceiver component, which can comprise an interleaver component, an ADC component, a calibration component, a decoder component, and a combiner component, for example.

At block 502, an analog signal, comprising data, can be received. The communication device can receive the analog signal from another communication device via a wireline or wireless communication channel or medium.

At block 504, the analog signal can be interleaved across respective interleaved ADC sub-components of a set (e.g., an array) of ADC sub-components. An interleaver component can facilitate interleaving the analog signal across the respective ADC sub-components, wherein the respective ADC sub-components can receive the analog signal with respective time-delays from the interleaver component.

At block 506, the respective time-delayed analog signals can be sampled to generate respective analog data samples to facilitate digitizing the respective time-delayed analog signals. The respective ADC sub-components can sample the respective time-delayed analog signals to generate the respective analog data samples.

At block 508, the respective analog data samples can be converted to respective digital data samples. The respective ADC sub-components can analyze the respective analog data samples and can digitize or convert the analog data samples to the respective digital data samples, wherein the respective digital data samples can correspond to the respective analog data samples.

At block 510, the respective data (e.g., data values) of the respective digital data samples can be determined. In some implementations, the combiner component can combine or integrate the respective digital data substreams (e.g., the respective digital data samples) to generate a digital data stream. The decoder component can decode the digital data stream, comprising the digital data samples, and/or the digital data samples can be analyzed (e.g., by the calibration component), to facilitate recovering (e.g., determining) the respective data from (of) the respective digital data samples.

At block 512, first transfer characteristics of the communication channel or medium between the communication device and the other communication device (e.g., the transmitting device) can be determined based at least in part on the recovered data from the signal. The calibration component can determine the first transfer characteristics of the communication channel or medium between the communication device and the other communication device (e.g., the transmitting device), based at least in part on the recovered data from the signal.

At block 514, respective second transfer characteristics of the other communication device to the respective ADC sub-components of the set of ADC sub-components can be determined based at least in part on the recovered data from the signal. The calibration component can determine the transfer characteristics of the other communication device to each of the ADC sub-components of the set of ADC sub-components, based at least in part on the recovered data from the signal.

At block 516, respective transfer functions of the respective ADC sub-components can be determined based at least in part on the first transfer characteristics and the respective second transfer characteristics. The calibration component can analyze the first transfer characteristics and the respective second transfer characters of the respective ADC sub-components. The calibration component can determine the respective transfer functions of the respective ADC sub-components based at least in part on the results of the analysis of the first transfer characteristics (e.g., the transfer characteristics of the communication channel or medium between the communication device and the other communication device) and the respective second transfer characteristics (e.g., the respective second transfer characteristics of the other communication device to the respective ADC sub-components of the set of ADC sub-components). For instance, for each ADC sub-component, the calibration component can use channel estimation to facilitate determining the transfer function of the ADC sub-component, based at least in part on information relating to the samples from the ADC sub-component and the remotely transmitted data from which the samples were generated.

At block 518, the respective ADC sub-components can be calibrated, based at least in part on the respective transfer functions of the ADC sub-components, to facilitate correcting or mitigating sub-ADC path differences between respective ADC sub-components. The calibration component can calibrate or adjust the respective ADC sub-components of the set of ADC sub-components, based at least in part on the respective transfer functions of the ADC sub-components, to facilitate correcting or mitigating sub-ADC path differences between respective ADC sub-components to facilitate mitigating distortions that would otherwise have be caused as a result of the uncorrected or unmitigated path differences. The combiner component can combine or integrate the respective digital data substreams from the respective ADC sub-components to generate a digital data stream that can comprise data that can correspond to the data (e.g., in analog form) contained in the received analog signal. As desired, the digital data stream can be further processed or can be provided (e.g., presented or displayed) as an output.

Figure 6:
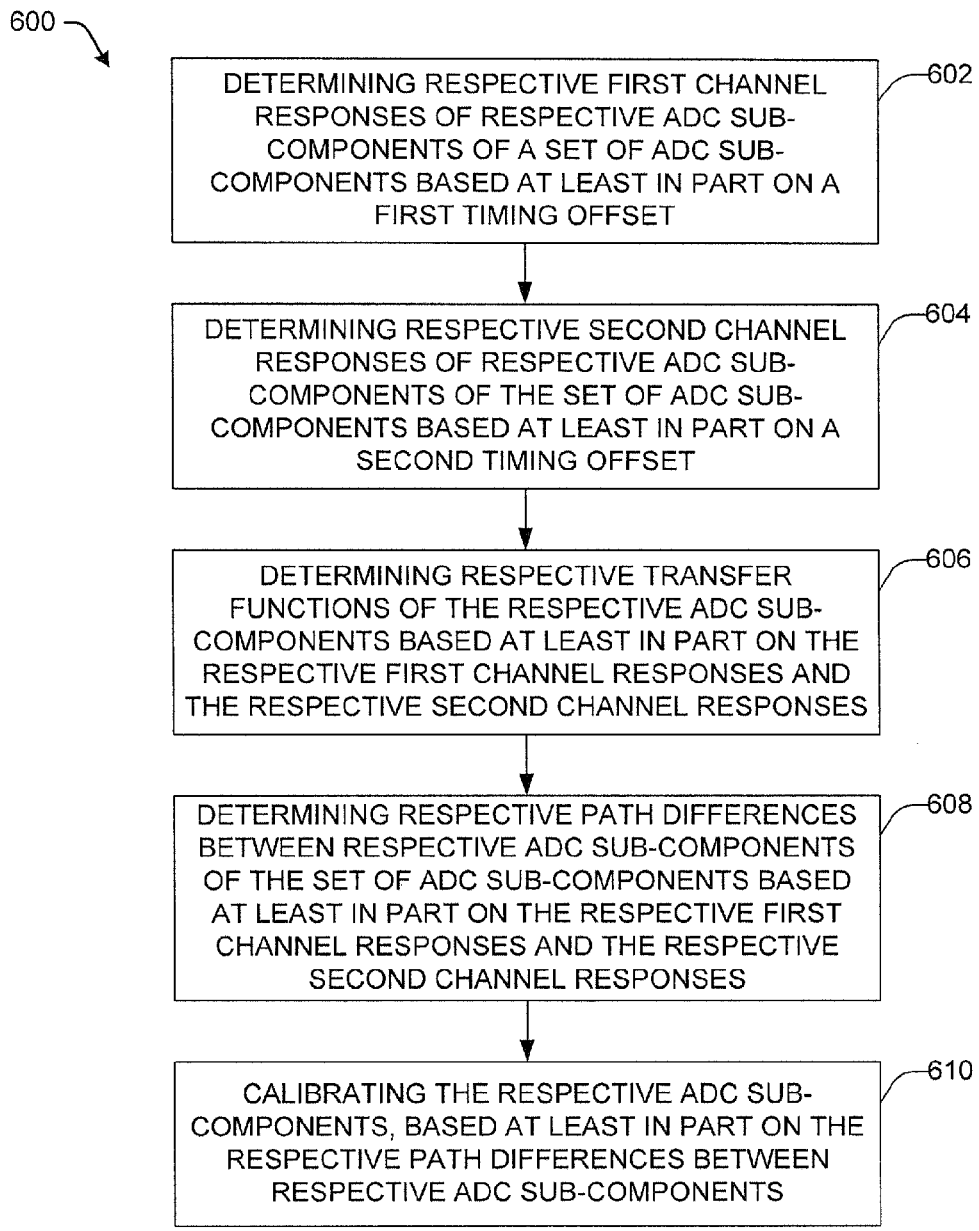
FIG. 6 presents a flow diagram of an example, non-limiting embodiment of a method that can determine or estimate respective sub-paths of sub-ADCs over a larger (e.g., over nominal) bandwidth or sampling frequency to facilitate calibrating sub-ADCs of an array of sub-ADCs of a transceiver component to facilitate correcting or mitigating sub-ADC path differences, in accordance with various aspects and embodiments of the disclosed subject matter.

FIG. 6 presents a flow diagram of an example method 600 that can determine or estimate respective sub-paths of sub-ADCs over a larger (e.g., over nominal) bandwidth or sampling frequency to facilitate calibrating sub-ADCs of an array of sub-ADCs of a transceiver component to facilitate correcting or mitigating sub-ADC path differences, in accordance with various aspects and embodiments of the disclosed subject matter. The method 600 can be implemented by a communication device, such as a transceiver component, which can comprise an ADC component and a calibration component, for example.

At block 602, respective first channel responses of respective ADC sub-components of a set (e.g., an array) of ADC sub-components (e.g., interleaved ADC sub-components) can be determined based at least in part on a first timing offset. The calibration component can intentionally introduce or implement the first timing offset (e.g., an timing offset of 0) to or on the respective ADC sub-components. The calibration component can determine or measure the respective first channel responses of the respective ADC sub-components based at least in part on a first timing offset (e.g., a first sampling offset), such as, for example, an offset of 0.

At block 604, respective second channel responses of respective ADC sub-components of the set of ADC sub-components can be determined based at least in part on a second timing offset. The calibration component can intentionally introduce or implement the second timing offset (e.g., an timing offset of T/2, wherein T can be the nominal sampling timing of the ADC component) to or on the respective ADC sub-components. The calibration component can determine or measure the respective second channel responses of the respective ADC sub-components based at least in part on the second timing offset (e.g., a second sampling offset), such as, for example, an offset of T/2.

At block 606, respective transfer functions of the respective ADC sub-components can be determined based at least in part on the respective first channel responses and the respective second channel responses. The calibration component can analyze the respective first channel responses and the respective second channel responses of the respective ADC sub-components and/or other information. The calibration component can determine the respective transfer functions of the respective ADC sub-components based at least in part on the results of the analysis of the respective first channel responses and the respective second channel responses.

At block 608, respective path differences between respective ADC sub-components of the set of ADC sub-components can be determined based at least in part on the respective first channel responses and the respective second channel responses. The calibration component can analyze the respective first channel responses and the respective second channel responses. The calibration component can determine the respective path differences (e.g., sub-ADC path differences) between respective ADC sub-components of the set of ADC sub-components based at least in part on the results of the analysis of the respective first channel responses and the respective second channel responses.

At block 610, the respective ADC sub-components can be calibrated, based at least in part on the respective path differences between respective ADC sub-components of the set of ADC sub-components, to facilitate correcting or mitigating the path differences between respective ADC sub-components. The calibration component can calibrate or adjust the respective ADC sub-components of the set of ADC sub-components, based at least in part on the respective transfer functions of the ADC sub-components, to facilitate correcting or mitigating sub-ADC path differences between respective ADC sub-components to facilitate mitigating distortions that would otherwise have be caused as a result of the uncorrected or unmitigated path differences.

Figure 7:
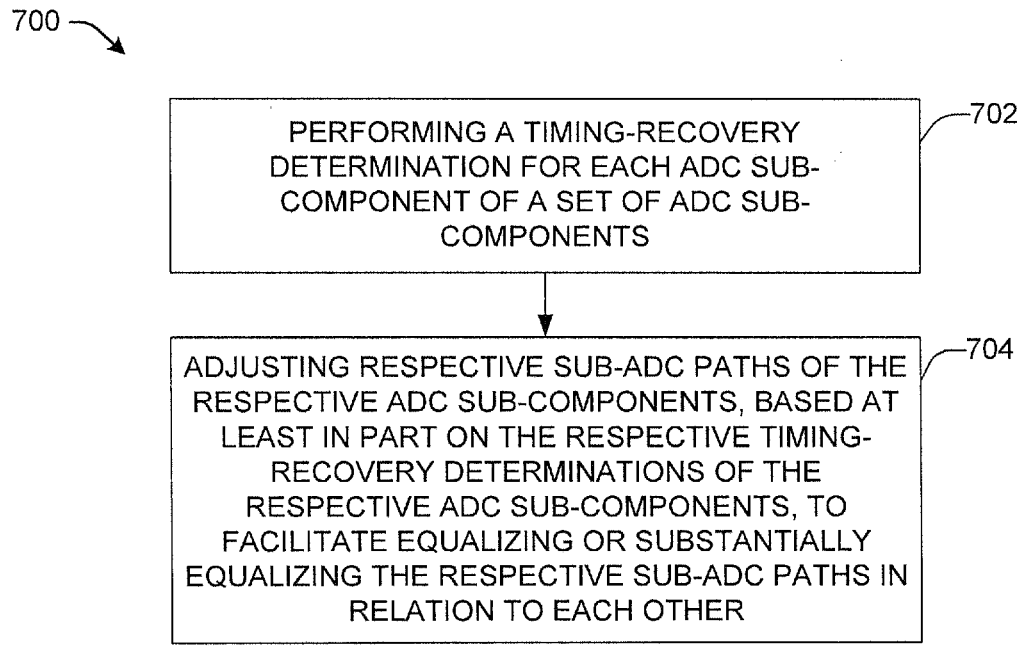
FIG. 7 depicts a flow diagram of an example, non-limiting embodiment of a method that can incorporate clock recovery to facilitate path correction for the ADC sub-components of a sub-ADC array to facilitate correcting or mitigating sub-ADC path differences, in accordance with various aspects and embodiments of the disclosed subject matter.

FIG. 7 depicts a flow diagram of an example method 700 that can incorporate clock recovery to facilitate path correction for the ADC sub-components of a sub-ADC array to facilitate correcting or mitigating sub-ADC path differences, in accordance with various aspects and embodiments of the disclosed subject matter. The method 700 can be implemented by a communication device, such as a transceiver component, which can comprise an ADC component and a calibration component, for example.

At block 702, a timing-recovery determination can be performed for each ADC sub-component of a set (e.g., an array) of ADC sub-components. The calibration component can incorporate clock recovery (e.g., into a sub-ADC path correction algorithm) to facilitate correcting the respective sub-ADC paths of the ADC sub-components to facilitate determining or calculating the timing recovery for each of the ADC sub-components of the array.

At block 704, respective sub-ADC paths of the respective ADC sub-components can be adjusted, based at least in part on the respective timing-recovery determinations of the respective ADC sub-components, to facilitate equalizing or substantially equalizing the respective sub-ADC paths in relation to each other. To facilitate calibrating the respective ADC sub-components, the calibration component can adjust the respective sub-ADC paths of the respective ADC sub-components, based at least in part on the respective timing-recovery determinations of the respective ADC sub-components, to facilitate equalizing or substantially equalizing the respective sub-ADC paths in relation to each other. Equalizing or at least substantially equalizing the respective sub-ADC paths of the respective ADC sub-components can facilitate correcting or mitigating distortions in the digital data stream produced by the ADC component that would otherwise have be caused as a result of the uncorrected or unmitigated path differences.

Figure 8:
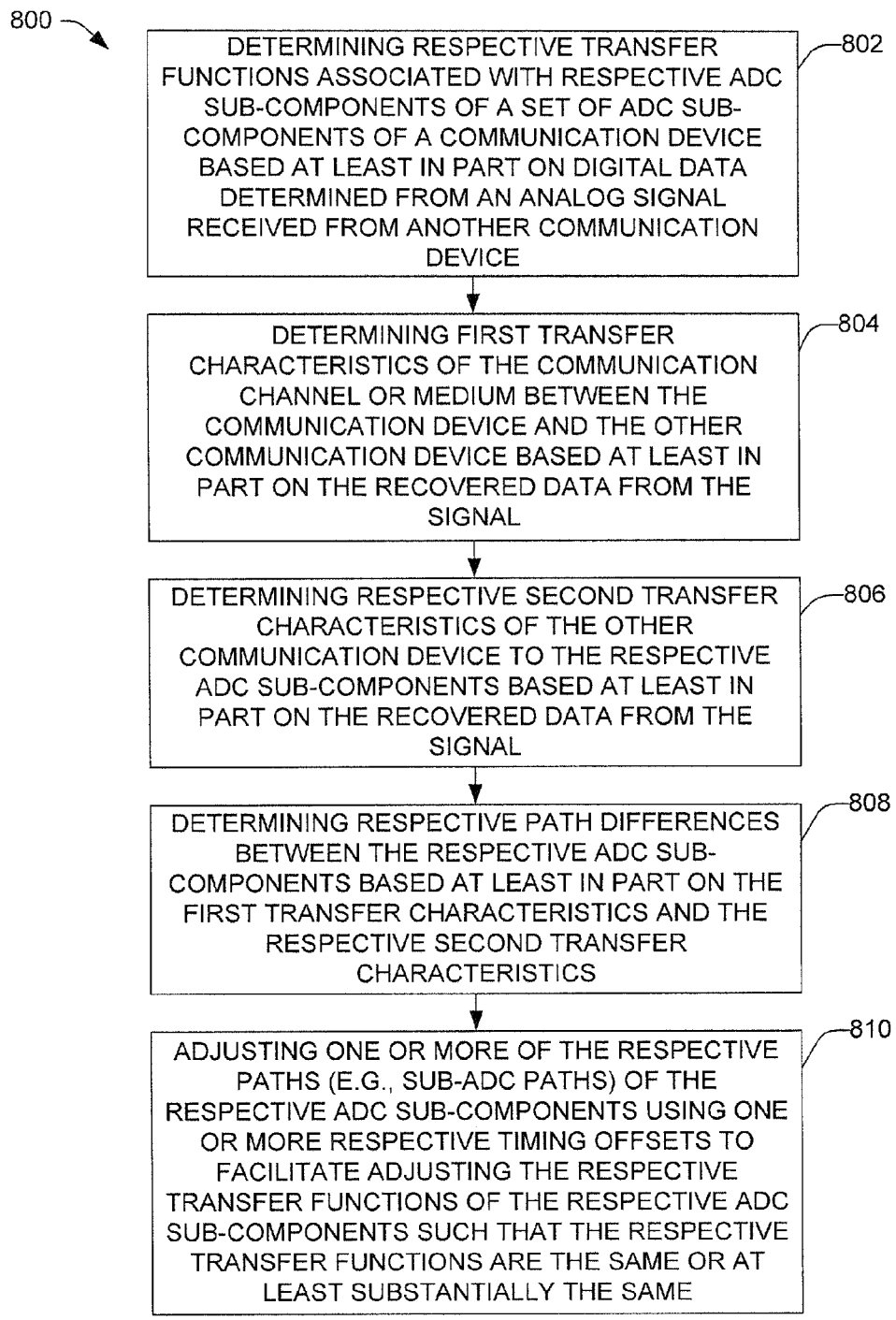
FIG. 8 presents a flow diagram of an example, non-limiting embodiment method that can adjust the sub-ADC paths of the ADC sub-components of a sub-ADC array using a timing offset to facilitate correcting or mitigating sub-ADC path differences, in accordance with various aspects and embodiments of the disclosed subject matter.

FIG. 8 presents a flow diagram of an example method 800 that can adjust the sub-ADC paths of the ADC sub-components of a sub-ADC array using a timing offset to facilitate correcting or mitigating sub-ADC path differences, in accordance with various aspects and embodiments of the disclosed subject matter. The method 800 can be implemented by a communication device, such as a transceiver component, which can comprise an ADC component and a calibration component, for example.

At block 802, respective transfer functions associated with respective ADC sub-components of a set (e.g., an array) of ADC sub-components of a communication device (e.g., a transceiver component) can be determined based at least in part on digital data determined from an analog signal received from another communication device. The communication device can receive an analog signal, comprising data, from the other communication device. The ADC sub-components of the ADC component, which can be interleaved, can sample and digitize the analog signal, wherein the respective ADC sub-components can receive respective analog signals with respective time-delays. The data (e.g., digital data) can be recovered from the digital data stream, comprising the digitized data samples (e.g., after the digital data stream is decoded by a decoder component).

At block 804, first transfer characteristics of the communication channel or medium between the communication device and the other communication device (e.g., the transmitting device) can be determined based at least in part on the recovered data from the signal. The calibration component can determine the first transfer characteristics of the communication channel or medium between the communication device and the other communication device, based at least in part on the recovered data from the signal.

At block 806, respective second transfer characteristics of the other communication device to the respective ADC sub-components of the set of ADC sub-components can be determined based at least in part on the recovered data from the signal. The calibration component can determine the transfer characteristics of the other communication device to each of the ADC sub-components of the set of ADC sub-components, based at least in part on the recovered data from the signal.

At block 808, respective path differences between the respective ADC sub-components of the set of ADC sub-components can be determined based at least in part on the first transfer characteristics and the respective second transfer characteristics. The calibration component can analyze the respective first transfer characteristics and the respective second transfer characteristics. The calibration component can determine the respective path differences (e.g., sub-ADC path differences) between respective ADC sub-components of the set of ADC sub-components based at least in part on the results of the analysis of the respective first transfer characteristics and the respective second transfer characteristics.

At block 810, one or more of the respective paths (e.g., sub-ADC paths) of the respective ADC sub-components can be adjusted using one or more respective timing offsets to facilitate adjusting the respective transfer functions of the respective ADC sub-components such that the respective transfer functions are the same or at least substantially the same. To facilitate calibrating the respective ADC sub-components of the set of ADC sub-components, the calibration component can apply one or more respective timing offsets to one or more of the respective paths of the respective ADC sub-components to adjust the one or more respective paths of the respective ADC sub-components to facilitate adjusting the respective transfer functions of the respective ADC sub-components until the respective transfer functions are the same or at least substantially the same, in accordance with defined path correction criteria. This can facilitate equalizing or at least substantially equalizing the respective sub-ADC path delays of the respective paths of the respective ADC sub-components without having to perform additional computations.

Figure 9:
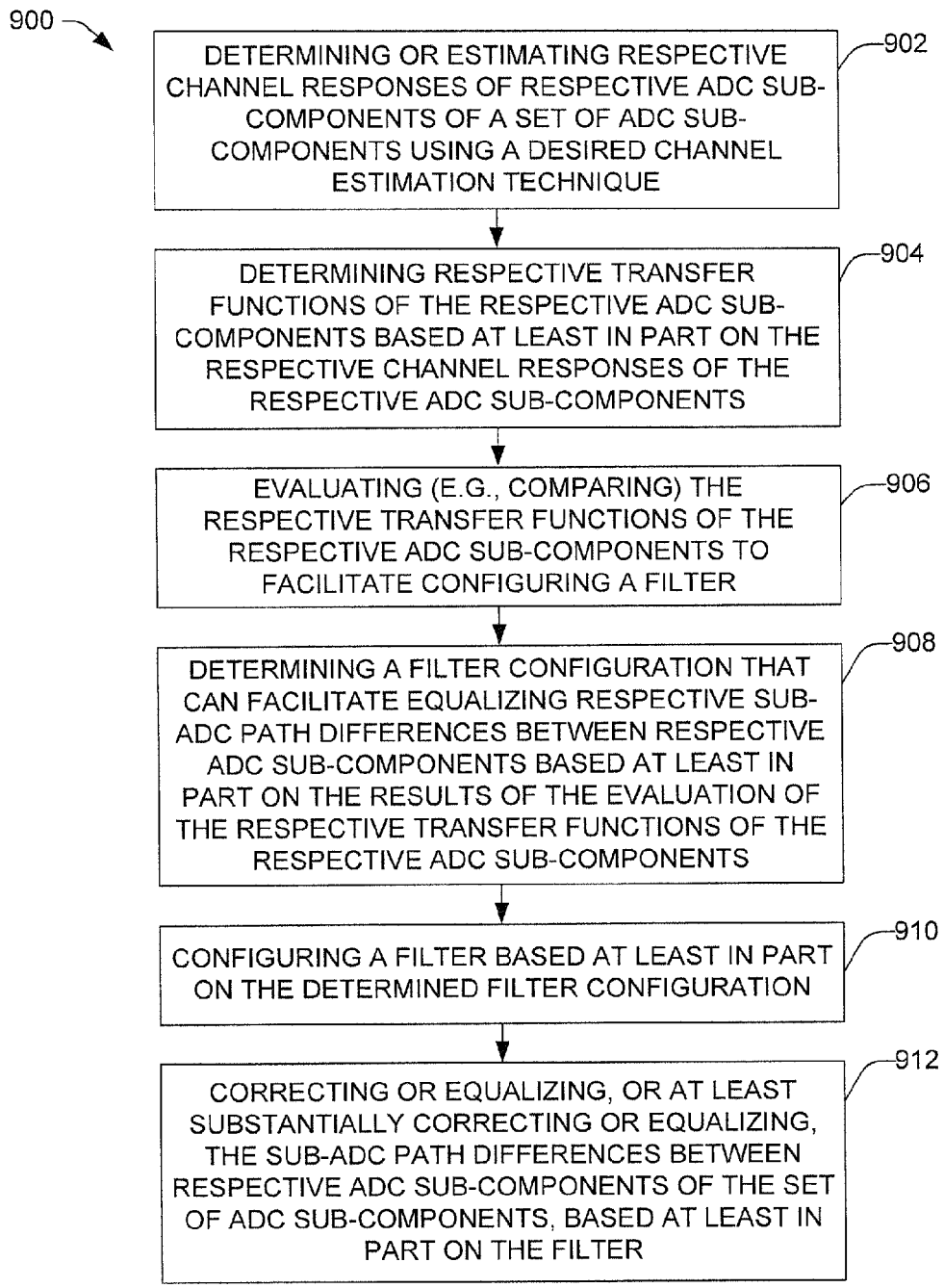
FIG. 9 illustrates a flow diagram of an example, non-limiting embodiment method that can configure a filter (e.g., digital filter or analog filter) to facilitate correcting or mitigating sub-ADC path differences, in accordance with various aspects and embodiments of the disclosed subject matter.

FIG. 9 illustrates a flow diagram of an example method 900 that can configure a filter (e.g., digital filter or analog filter) to facilitate correcting or mitigating sub-ADC path differences, in accordance with various aspects and embodiments of the disclosed subject matter. The method 900 can be implemented by a communication device, such as a transceiver component, which can comprise an ADC component and a calibration component, for example.

At block 902, respective channel responses of respective ADC sub-components of a set (e.g., an array) of ADC sub-components can be determined or estimated using a desired channel estimation technique, such as disclosed herein. The calibration component can employ a desired channel estimation technique to facilitate determining or estimating the respective channel responses of the respective ADC sub-components of the array.

At block 904, respective transfer functions of the respective ADC sub-components can be determined based at least in part on the respective channel responses of the respective ADC sub-components. The calibration component can analyze the respective channel responses of the respective ADC sub-components and/or other information. The calibration component can determine the respective transfer functions of the respective ADC sub-components based at least in part on the results of the analysis of the respective channel responses.

At block 906, the respective transfer functions of the respective ADC sub-components can be evaluated (e.g., compared) to facilitate configuring a filter. The calibration component can evaluate the respective transfer functions of the respective ADC sub-components to facilitate configuring a filter (e.g., a digital filter or analog filter) that can facilitate correcting or mitigating sub-ADC path differences between respective ADC sub-components.

At block 908, a filter configuration that can facilitate equalizing respective sub-ADC path differences between respective ADC sub-components can be determined based at least in part on the results of the evaluation of the respective transfer functions of the respective ADC sub-components. The calibration component can determine the filter configuration based at least in part on the transfer function evaluation results.

At block 910, a filter can be configured based at least in part on the determined filter configuration. The calibration component can configure the filter based at least in part on the filter configuration. In some implementations, the filter can be a digital filter that can be employed to process digital signals (e.g., digital data substreams) of the ADC sub-components (e.g., after the analog signal has been converted to a digital signal by the ADC component). In other implementations, the filter can be an analog filter that can be employed to process received analog signals (e.g., analog data substreams) of the ADC sub-components (e.g., prior to the analog signal being converted to a digital signal by the ADC component). The calibration component can generate or configure the filter using iterative or adaptive filter configuration techniques, or by performing computations to directly determine the filter configuration.

At block 912, the sub-ADC path differences between respective ADC sub-components of the set of ADC sub-components can be corrected or equalized, or at least substantially corrected or equalized, based at least in part on the filter. The calibration component can implement or use the filter to facilitate correcting or equalizing, or at least substantially correcting or equalizing, the sub-ADC path differences between respective ADC sub-components of the set of ADC sub-components, in accordance with (e.g., to satisfy) defined path correction criteria. Correcting or equalizing the respective sub-ADC paths between respective ADC sub-components can facilitate mitigating distortions in the digital data stream produced by the ADC component that would otherwise have be caused as a result of the uncorrected or unmitigated path differences.

Figure 10:
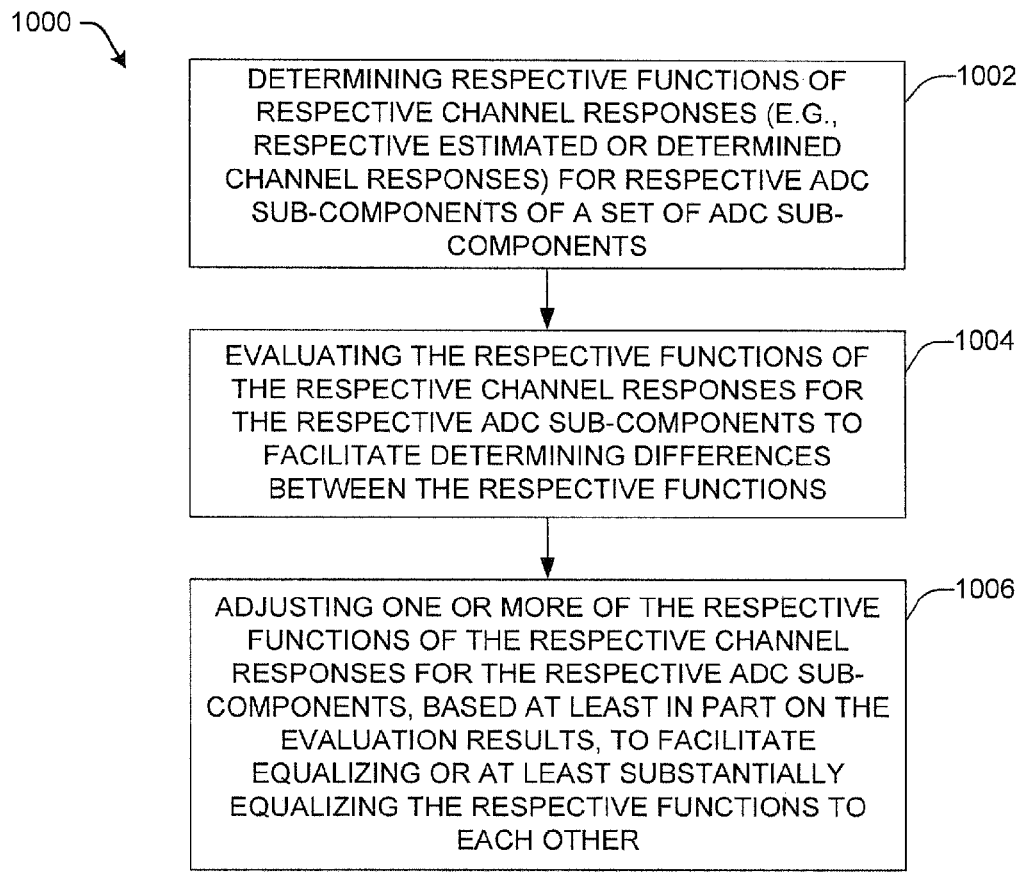
FIG. 10 presents a flow diagram of an example, non-limiting embodiment method that can determine respective functions of respective estimated sub-ADC channels to facilitate correcting or mitigating sub-ADC path differences, in accordance with various aspects and embodiments of the disclosed subject matter.

FIG. 10 presents a flow diagram of an example method 1000 that can determine respective functions of respective estimated sub-ADC channels to facilitate correcting or mitigating sub-ADC path differences, in accordance with various aspects and embodiments of the disclosed subject matter. The method 1000 can be implemented by a communication device, such as a transceiver component, which can comprise an ADC component and a calibration component, for example.

At block 1002, respective functions of respective channel responses (e.g., respective estimated or determined channel responses) can be determined for respective ADC sub-components of a set (e.g., an array) of ADC sub-components. The calibration component can determine or compute the respective functions of the respective channel responses for the respective ADC sub-components. For example, for each ADC sub-component, the calibration component can determine or calculate a set of desired multi-tap responses (e.g., determine or calculate the largest 2-tap responses) of the channel of the ADC sub-component.

At block 1004, the respective functions of the respective channel responses for the respective ADC sub-components can be evaluated to facilitate determining differences between the respective functions. The calibration component can evaluate or compare the respective functions of the respective channel responses for the respective ADC sub-components in relation to each other. For example, the calibration component can compare the respective multi-tap responses (e.g., the largest 2-tap responses) of the respective ADC sub-components to each other to facilitate determining differences between the respective multi-tap responses of the respective ADC sub-components.

At block 1006, one or more of the respective functions of the respective channel responses for the respective ADC sub-components can be adjusted, based at least in part on the evaluation results, to facilitate equalizing or at least substantially equalizing the respective functions to each other (e.g., to facilitate making the respective functions the same or at least substantially the same). Based at least in part on the evaluation results, to facilitate calibrating the respective ADC sub-components, the calibration component can adjust one or more of the respective functions of the respective channel responses of the respective ADC sub-components to facilitate equalizing or at least substantially equalizing the respective functions to each other. For example, the calibration component can respectively adjust one or more respective functions, parameters, or control mechanisms associated with the respective multi-tap responses of the respective ADC sub-components to facilitate causing the respective multi-tap responses to be the same or substantially the same (e.g., to facilitate reducing or minimizing the differences between the respective multi-tap responses), which can facilitate making the respective sub-ADC paths of the respective ADC sub-components the same or substantially the same, in accordance with the defined path correction criteria.

In some implementations, the calibration component can execute an algorithm (e.g., a function adjustment algorithm) to facilitate adjusting the respective functions of the respective channel responses of the respective ADC sub-components. The algorithm can be an iterative algorithm or a non-iterative algorithm. The calibration component can execute the algorithm and/or perform the adjustments to the respective functions digitally or in analog (e.g., in the digital domain or in the analog domain). Employing the algorithm, the calibration component can facilitate reducing or minimizing the differences between the respective multi-tap responses to facilitate calibrating the respective ADC sub-components and correcting or mitigating sub-ADC path differences to facilitate mitigating distortions in the digital data stream produced by the ADC component that would otherwise have be caused as a result of the uncorrected or unmitigated path differences.

Example Computing Environment

Figure 11:
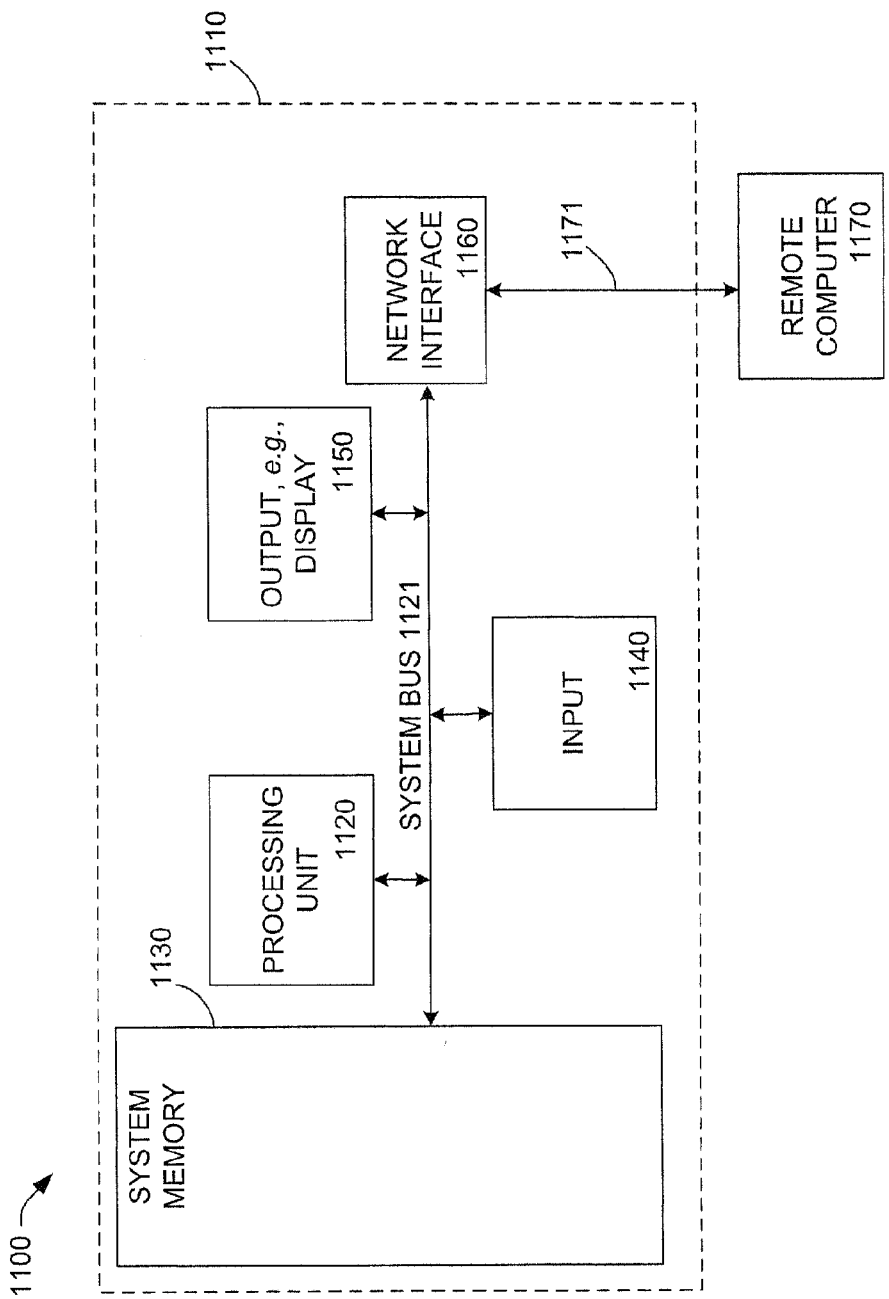
FIG. 11 illustrates a block diagram of an example electronic computing environment that can be implemented in conjunction with one or more aspects described herein.

As mentioned, advantageously, the techniques described herein can be applied to any device and/or network where calibration of ADC sub-components of an ADC component is desirable in a system comprising a communication device (e.g., transceiver component). It is to be understood, therefore, that handheld, portable and other computing devices and computing objects of all kinds are contemplated for use in connection with the various non-limiting embodiments, e.g., anywhere that it can be desirable for a device to implement calibration of ADC sub-components of an ADC component associated with a system that is associated with a communication device. Accordingly, the below general purpose remote computer described below in FIG. 11 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 11 thus illustrates an example of a suitable computing system environment 1100 in which some aspects of the disclosed subject matter can be implemented, although as made clear above, the computing system environment 1100 is only one example of a suitable computing environment for a device and is not intended to suggest any limitation as to the scope of use or functionality of the disclosed subject matter. Neither should the computing environment 1100 be interpreted as having any dependency or requirement relating to any one or combination of components illustrated in the exemplary operating environment 1100.

With reference to FIG. 11, an exemplary device for implementing the disclosed subject matter includes a general-purpose computing device in the form of a computer 1110. Components of computer 1110 may include, but are not limited to, a processing unit 1120, a system memory 1130, and a system bus 1121 that couples various system components including the system memory to the processing unit 1120. The system bus 1121 may be any of several types of bus structures including a memory bus or memory controller, a peripheral bus, and a local bus using any of a variety of bus architectures.

Computer 1110 typically includes a variety of computer readable media. Computer readable media can be any available media that can be accessed by computer 1110. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 1110. Communication media typically embodies computer readable instructions, data structures, program modules, or other data in a modulated data signal such as a carrier wave or other transport mechanism and includes any information delivery media.

The system memory 1130 may include computer storage media in the form of volatile and/or nonvolatile memory such as read only memory (ROM) and/or random access memory (RAM). A basic input/output system (BIOS), containing the basic routines that help to transfer information between elements within computer 1110, such as during start-up, may be stored in memory 1130. Memory 1130 typically also contains data and/or program modules that are immediately accessible to and/or presently being operated on by processing unit 1120. By way of example, and not limitation, memory 1130 may also include an operating system, application programs, other program modules, and program data.

The computer 1110 may also include other removable/non-removable, volatile/nonvolatile computer storage media. For example, computer 1110 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 1121 through a non-removable memory interface such as an interface, and a magnetic disk drive or optical disk drive is typically connected to the system bus 1121 by a removable memory interface, such as an interface.

A user can enter commands and information into the computer 1110 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 1120 through user input 1140 and associated interface(s) that are coupled to the system bus 1121, but may be connected by other interface and bus structures, such as a parallel port, game port, or a universal serial bus (USB). A graphics subsystem can also be connected to the system bus 1121. A projection unit in a projection display device, or a HUD in a viewing device or other type of display device can also be connected to the system bus 1121 via an interface, such as output interface 1150, which may in turn communicate with video memory. In addition to a monitor, computers can also include other peripheral output devices such as speakers which can be connected through output interface 1150.

The computer 1110 can operate in a networked or distributed environment using logical connections to one or more other remote computer(s), such as remote computer 1170, which can in turn have media capabilities different from device 1110. The remote computer 1170 can be a personal computer, a server, a router, a network PC, a peer device, personal digital assistant (PDA), cell phone, handheld computing device, a projection display device, a viewing device, or other common network node, or any other remote media consumption or transmission device, and may include any or all of the elements described above relative to the computer 1110. The logical connections depicted in FIG. 11 include a network 1171, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 1110 can be connected to the LAN 1171 through a network interface or adapter. When used in a WAN networking environment, the computer 1110 can typically include a communications component, such as a modem, or other means for establishing communications over the WAN, such as the Internet. A communications component, such as wireless communications component, a modem and so on, which can be internal or external, can be connected to the system bus 1121 via the user input interface of input 1140, or other appropriate mechanism. In a networked environment, program modules depicted relative to the computer 1110, or portions thereof, can be stored in a remote memory storage device. It will be appreciated that the network connections shown and described are exemplary and other means of establishing a communications link between the computers can be used.

EXAMPLE NETWORKING ENVIRONMENT

Figure 12:
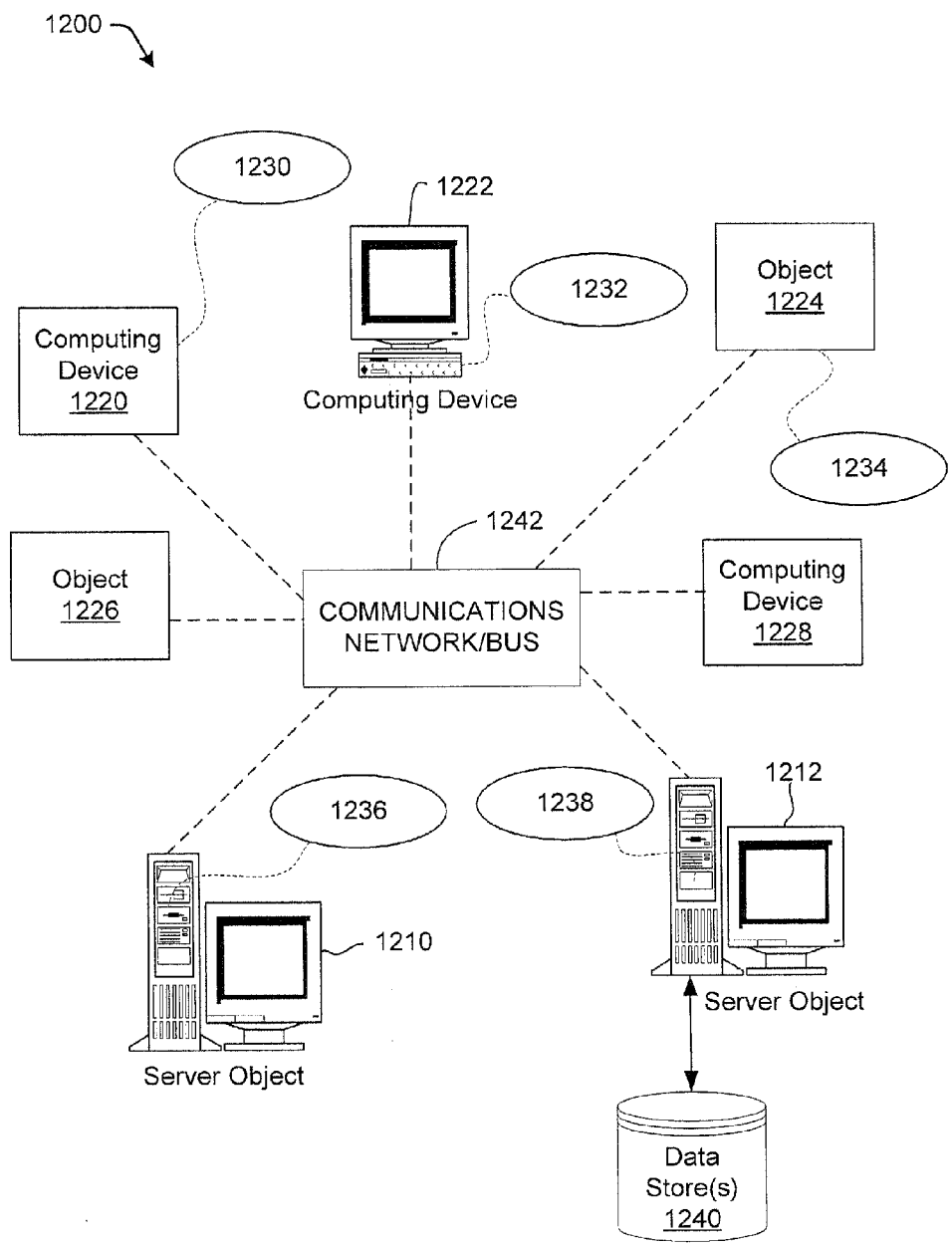
FIG. 12 illustrates a block diagram of an example data communication network that can be operable in conjunction with various aspects described herein.

FIG. 12 provides a schematic diagram of an exemplary networked or distributed computing environment 1200. The distributed computing environment comprises computing objects 1210, 1212, etc. and computing objects or devices 1220, 1222, 1224, 1226, 1228, etc., which may include programs, methods, data stores, programmable logic, etc., as represented by applications 1230, 1232, 1234, 1236, 1238 and data store(s) 1240. It can be appreciated that computing objects 1210, 1212, etc. and computing objects or devices 1220, 1222, 1224, 1226, 1228, etc. may comprise different devices, including a multimedia display device or similar devices depicted within the illustrations, or other devices such as a mobile phone, personal digital assistant (PDA), audio/video device, MP3 players, personal computer, laptop, etc. It should be further appreciated that data store(s) 1240 can include one or more cache memories, one or more registers, or other similar data stores disclosed herein.

Each computing object 1210, 1212, etc. and computing objects or devices 1220, 1222, 1224, 1226, 1228, etc. can communicate with one or more other computing objects 1210, 1212, etc. and computing objects or devices 1220, 1222, 1224, 1226, 1228, etc. by way of the communications network 1242, either directly or indirectly. Even though illustrated as a single element in FIG. 12, communications network 1242 may comprise other computing objects and computing devices that provide services to the system of FIG. 12, and/or may represent multiple interconnected networks, which are not shown. Each computing object 1210, 1212, etc. or computing object or devices 1220, 1222, 1224, 1226, 1228, etc. can also contain an application, such as applications 1230, 1232, 1234, 1236, 1238, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 12, as a non-limiting example, computing objects or devices 1220, 1222, 1224, 1226, 1228, etc. can be thought of as clients and computing objects 1210, 1212, etc. can be thought of as servers where computing objects 1210, 1212, etc., acting as servers provide data services, such as receiving data from client computing objects or devices 1220, 1222, 1224, 1226, 1228, etc., storing of data, processing of data, transmitting data to client computing objects or devices 1220, 1222, 1224, 1226, 1228, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 1242 or bus is the Internet, for example, the computing objects 1210, 1212, etc. can be Web servers with which other computing objects or devices 1220, 1222, 1224, 1226, 1228, etc. communicate via any of a number of known protocols, such as the hypertext transfer protocol (HTTP). Computing objects 1210, 1212, etc. acting as servers may also serve as clients, e.g., computing objects or devices 1220, 1222, 1224, 1226, 1228, etc., as may be characteristic of a distributed computing environment.

Reference throughout this specification to "one embodiment," "an embodiment," "an example," "an implementation," "a disclosed aspect," or "an aspect" means that a particular feature, structure, or characteristic described in connection with the embodiment, implementation, or aspect is included in at least one embodiment, implementation, or aspect of the present disclosure. Thus, the appearances of the phrase "in one embodiment," "in one example," "in one aspect," "in an implementation," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the disclosed subject matter. It is, of course, not possible to describe every conceivable combination of components or methodologies for purposes of describing the disclosed subject matter, but one of ordinary skill in the art can recognize that many further combinations and permutations of the disclosed subject matter are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system, comprising:
   a converter component comprising a plurality of converter sub-components for converting respective time-delayed analog signals, associated with an analog signal received from a remote communication component, to respective digital data samples that comprise respective encoded data, wherein the analog signal comprises data, and digital data corresponding to the data is determined based on decoding the respective digital data samples; and
   a calibration component for determining respective transfer functions associated with respective converter sub-components of the plurality of converter sub-components based at least in part on an analysis of the digital data and the respective digital data samples, and calibrating the respective converter sub-components based at least in part on the respective transfer functions to facilitate mitigating path differences between the respective converter sub-components.

2. The system of claim 1, wherein the calibration component uses channel estimation to facilitate the determining of the respective transfer functions associated with the respective converter sub-components, and the channel estimation is least-squares channel estimation, data cross-correlation, iterative channel estimation, least-mean-square channel estimation, recursive least squares channel estimation, or blind channel estimation.

3. The system of claim 1, wherein the calibration component determines transfer characteristics associated with a communication channel or medium between the communication component and the remote communication component based at least in part on the respective digital data samples.

4. The system of claim 1, wherein the calibration component determines respective transfer characteristics associated with the remote communication component with respect to the respective converter sub-components based at least in part on the respective digital data samples;
   the calibration component determines respective path differences between the respective converter sub-components based at least in part on the transfer characteristics associated with the communication channel or medium between the communication component and the remote communication component, and the respective transfer characteristics associated with the remote communication component with respect to the respective converter sub-components; and the calibration component determines a calibration to apply to the respective converter sub-components, based at least in part on the respective path differences between the respective converter sub-components, to facilitate the calibration of the respective converter sub-components.

5. The system of claim 1, wherein the calibration component determines a channel response associated with a converter sub-component of the plurality of converter sub-components over a bandwidth or sampling frequency that is larger than a nominal bandwidth or nominal sampling frequency associated with the converter sub-component.

6. The system of claim 1, wherein the calibration component determines a first channel response associated with a converter sub-component of the set of converter sub-components based at least in part on a first offset value, determines a second channel response associated with the converter sub-component based at least in part on a second offset value, and determines a path difference between the converter sub-component and a second converter sub-component of the plurality of converter sub-components based at least in part on the first channel response and the second channel response.

7. The system of claim 1, wherein the calibration component incorporates clock recovery into a path correction algorithm and executes the path correction algorithm to facilitate mitigating path differences between the respective converter sub-components.

8. The system of claim 1, wherein the calibration component adjusts at least one timing offset associated with at least one converter sub-component of the plurality of converter sub-components to facilitate modifying the respective transfer functions associated with the respective converter sub-components to cause the respective transfer functions to be equalized or at least substantially equalized.

9. The system of claim 1, wherein the calibration component configures a correction filter based at least in part on respective channel responses determined for the respective converter sub-components, and applies the correction filter to respective signals of the respective converter sub-components to facilitate equalizing or reducing path differences between the respective converter sub-components;

the correction filter is an analog filter or a digital filter, and the respective signals comprise the respective time-delayed analog signals or the respective digital data samples; and the calibration component employs at least one of an iterative process, an adaptive process, or direct computation to facilitate the configuring of the correction filter.

10. The system of claim 1, wherein the calibration component determines respective functions of respective channel responses associated with the respective converter sub-components, and equalizes or substantially equalizes channel delays of the respective converter sub-components based at least in part on the respective functions of the respective channel responses associated with the respective converter sub-components.

11. The system of claim 1, wherein the calibration component determines respective multi-tap responses for the respective converter sub-components, compares the respective multi-tap responses, and adjusts a function, a parameter, or a control mechanism based at least in part on a result of the comparison of the respective multi-tap responses to facilitate causing the respective multi-tap responses to be same or substantially the same.

12. The system of claim 1, wherein the respective converter sub-components are interleaved.

13. A system, comprising:
a converter component comprising a plurality of converter sub-components for converting respective time-delayed analog signals, associated with an analog signal received from a remote communication component, to respective digital data samples that comprise respective encoded data, wherein the analog signal comprises data, and digital data representing the data is determined based on decoding the respective digital data samples;

a calibration component for determining respective transfer functions associated with respective converter sub-components of the plurality of converter sub-components based at least in part on an analysis of the digital data and the respective digital data samples, and calibrating the respective converter sub-components based at least in part on the respective transfer functions to facilitate mitigating path differences between the respective converter sub-components; and at least one of:
an interleaver component for processing the analog signal to generate the respective time-delayed analog signals, and providing the respective time-delayed analog signals to the respective converter sub-components, a decoder component for decoding the respective digital data samples to facilitate determining the digital data, or a combiner component for combining digital data sub-streams, comprising the respective encoded data, to generate a digital data stream that corresponds to the analog signal.

14. A method, comprising:
determining, by a system comprising a processor, respective transfer functions associated with respective converter sub-components of a plurality of converter sub-components based at least in part on an analysis of respective digital data samples that are based at least in part on respective time-delayed analog signals, associated with an analog signal that comprises data and is received from a remote communication device, and decoded data corresponding to the data, wherein the decoded data is determined based on decoding the respective digital data samples that comprise respective encoded data; and adjusting, by the system, the respective converter sub-components based at least in part on the respective transfer functions to facilitate mitigating path differences between the respective converter sub-components.

15. The method of claim 14, further comprising:
converting, by the system, the respective time-delayed analog signals to the respective digital data samples.

16. The method of claim 14, further comprising:
determining, by the system, respective channel responses associated with the respective converter sub-components using channel estimation to facilitate the determining of the respective transfer functions associated with the respective converter sub-components.

17. The method of claim 14, further comprising:
determining, by the system, transfer characteristics associated with a communication channel or medium between the remote communication device and a communication device that received the analog signal based at least in part on the respective digital data samples;

determining, by the system, respective transfer characteristics of the remote communication device to the respective converter sub-components based at least in part on the respective digital data samples;

determining, by the system, respective path differences between the respective converter sub-components based at least in part on the transfer characteristics associated with the communication channel or medium between the remote communication component and the communication device, and the respective transfer characteristics of the remote communication device to the respective converter sub-components; and determining, by the system, an adjustment to apply to the respective converter sub-components, based at least in part on the respective path differences between the respective converter sub-components, to facilitate the adjusting of the respective converter sub-components.

18. The method of claim 14, further comprising:

determining, by the system, a first channel response associated with a converter sub-component of the plurality of converter sub-components based at least in part on a first offset value;

determining, by the system, a second channel response associated with the converter sub-component based at least in part on a second offset value; and determining, by the system, a path difference between the converter sub-component and a second converter sub-component of the plurality of converter sub-components based at least in part on the first channel response and the second channel response.

19. The method of claim 14, further comprising at least one of:

a) incorporating, by the system, clock recovery into a path correction algorithm, and executing the path correction algorithm to facilitate mitigating path differences between the respective converter sub-components;

b) modifying, by the system, one or more timing offsets associated with one or more converter sub-components of the plurality of converter sub-components to facilitate modifying the respective transfer functions associated with the respective converter sub-components to cause the respective transfer functions to be same or at least substantially the same; or c) determining, by the system, respective functions of respective channel responses associated with the respective converter sub-components, and adjusting channel delays of the respective converter sub-components based at least in part on the respective functions of the respective channel responses associated with the respective converter sub-components to facilitate equalizing or substantially equalizing the channel delays of the respective converter sub-components.

20. The method of claim 14, further comprising:

determining, by the system, respective channel responses for the respective converter sub-components;

configuring, by the system, a correction filter based at least in part on the respective channel responses; and applying, by the system, the correction filter to respective signals of the respective converter sub-components to facilitate equalizing or reducing path differences between the respective converter sub-components, wherein the correction filter is an analog filter or a digital filter, and the respective signals comprise the respective time-delayed analog signals or the respective digital data samples.

* * * * *